(12) United States Patent
Freeman et al.

(10) Patent No.: US 6,194,900 B1
(45) Date of Patent: Feb. 27, 2001

(54) INTEGRATED MINIATURIZED DEVICE FOR PROCESSING AND NMR DETECTION OF LIQUID PHASE SAMPLES

(75) Inventors: Dominique M. Freeman, Pescadero; Sally A. Swedberg, Palo Alto, both of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/100,495

(22) Filed: Jun. 19, 1998

(51) Int. Cl.[7] .............................. G01R 33/20; G01V 3/00

(52) U.S. Cl. .......................................... 324/321; 324/318

(58) Field of Search ..................................... 324/307, 321, 324/318, 322; 422/68.1, 70; 156/272.8; 210/198.2

(56) References Cited

U.S. PATENT DOCUMENTS 6,033,628 * 3/2000 Kaltenbach et al. ................. 422/68.1

* cited by examiner

Primary Examiner—Christine Oda
Assistant Examiner—Tiffany A. Fetzner
(74) Attorney, Agent, or Firm—Michael J. Beck

(57) ABSTRACT

A miniaturized total analysis system with an in-line NMR detection compartment and an NMR rf microcoil detector is described for use in liquid phase analysis. The device is formed by microfabrication of microstructures in novel support substrates. The NMR detector coil may be fabricated directly in the support body at the point of detection or, alternatively, may be formed as part of a modular structure that is insertable into the device at the point of detection. In addition, an integrated device for sample preparation and NMR detection is provided comprising the miniaturized total analysis system and a miniature magnet configured to accept the miniaturized total analysis system, wherein the device is capable of generating an NMR spectrum. The invention herein is used for the analysis of small and/or macromolecular and/or other solutes in the liquid phase.

90 Claims, 22 Drawing Sheets

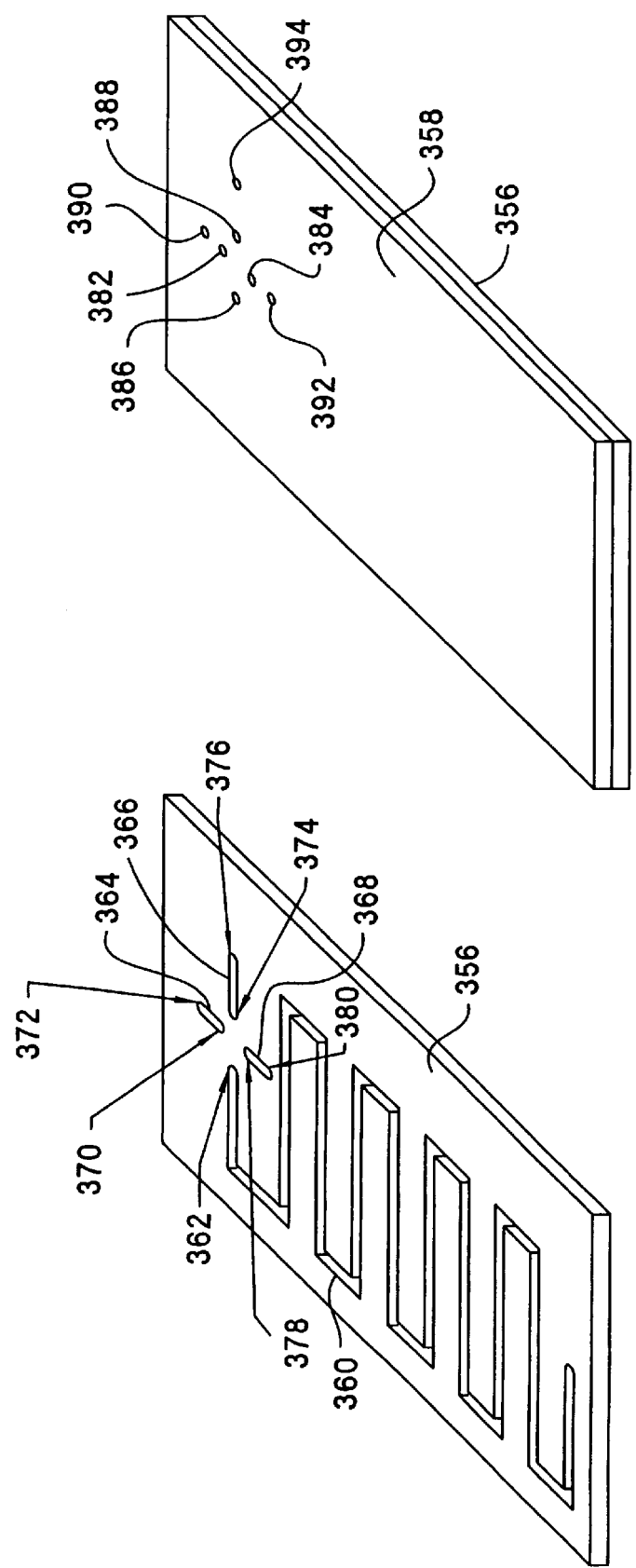

INTEGRATED MINIATURIZED DEVICE FOR PROCESSING AND NMR DETECTION OF LIQUID PHASE SAMPLES

TECHNICAL FIELD

The present invention relates generally to miniaturized liquid phase sample processing and analysis. More particularly, the invention relates to a miniaturized planar sample preparation and analysis device with an integrated on-chip miniature nuclear magnetic resonance ("NMR") radiofrequency coil. Both the sample preparation and analysis device and the NMR radiofrequency coil are manufactured using a variety of means suitable for microfabrication of substrate materials such as, but not limited to ablation, molding and embossing. The device is intended to be used with high-field, low-cost miniature magnets with the intention of achieving high throughput, fast time-to-result analysis of biological liquids in a truly integrated fashion.

BACKGROUND

Real time identification of analytes in a complex biological fluid is difficult, and requires careful thought as to (a) the preparation of the sample, (b) whether a separation step is required to simplify the signal, (c) whether a detection method can be employed which has no effect on the sample itself, (e.g. non-destructive). An ideal device would allow rapid detection of a wide range of simple or complex molecules in the liquid phase, at biological concentrations, and yield information about chemical structure and composition. A desirable feature of the detection method would be to enable the separation criteria to be relaxed such that sample preparation and detection could occur in series, without the need for complex separation technology. An on-line detector is particularly advantageous when sample size is limited, and additional analysis of the sample is required. Moreover, mass spectrometry ("MS") and NMR are detection methods well suited to yielding high quality chemical information for multi-component samples, requiring no a priori knowledge of the constituents.

Though much has been discussed in the literature towards realizing integrated separation technology including sample preparation and separation devices, and associated fluidics so that low yield or precious samples may be prepared and analyzed, little has been realized to date. In sample analysis instrumentation, particularly in separation systems involving capillary electrophoresis or liquid chromatography, smaller dimensions of the sample handling conduits and separation compartments result in improved performance characteristics, while reducing cost of production and analysis. Miniaturization of the sample preparation or separation region, to result in small sample volume requirements, necessarily means a greater demand on the detection method both by virtue of sample volume and potentially, sensitivity.

There are many types of detection methods possible. Optical transmission methods such as refractive index, ultraviolet-visible ("UV-VIS") and infrared ("IR") are relatively inexpensive, but are unable to give complex chemical structure and composition information. Furthermore they are path-length limited and sensitivity of detection is limited. Infrared spectroscopy is relatively insensitive, particularly to contaminants, and yields only functional group or fingerprint identification. MS is a sensitive method giving mass information; however, MS has the drawback of requiring sample preparation for nonvolatile analytes, as well as being destructive to the sample.

One of the most powerful analytical methods for molecular structure information is NMR. NMR provides spectral information as a function of the electronic environment of the molecule and is nondestructive to the sample. In addition, reaction rates, coupling constants, bond-lengths, and two- and three-dimensional structure can be obtained with this technique. The strength of both NMR and MS is the ability to derive fundamental chemical structure information, which is high resolution in terms of either chemical shift or mass, yielding the possibility of simultaneous analysis of multiple species. The inherent insensitivity of the NMR method however, has limited its usefulness as a detection method for liquid phase analysis of very small samples, such as effluent from a liquid chromatography or capillary electrophoretic separation.

NMR combined with liquid chromatography or capillary electrophoresis was demonstrated as early as 1978 using stopped flow (Watanabe et al. (1978) *Proc. Jpn. Acad.* 54:194), and in 1979 with continuous flow (Bayer et al. (1979) *J. Chromatog.* 186:497–507), though limitations due to solvent as well as inherent sensitivity curtailed the use of the method. See Dorn et al. (1984) *Anal. Chem.* 56:747–758 for a review.

Recent experiments using NMR as a detector for nanoliter sample volumes, suggests that NMR could provide a greater detection sensitivity than in previous investigations. Wu et al. (1994a) *J. Am. Chem. Soc.* 116:7929–7930; Olson et al. (1995) *Science* 270:1967–1970; Wu et al. (1994b) *Anal. Chem.* 66:3849–3857; and Wu et al. (1995) *Anal. Chem.* 67:3101–3107. Unfortunately, though observations were made on nanoliter volumes, the findings translate into millimolar levels of detection sensitivity.

A number of areas can be targeted to increase the sensitivity of NMR detection for liquid phase analysis. Resistive losses, operating temperature, sample ionic strength, filling factor, and coil geometry affect the sensitivity of the coil. Cooling the radiofrequency coil and using superconducting coil material have resulted in some gain in signal-to-noise through reduction in coil resistance and thermal properties. However, it is difficult to achieve the theoretical maximum, since detecting signal from a room temperature liquid sample using a cryogenically cooled radiofrequency probe has proven difficult.

The NMR signal-to-noise is directly proportional to the sample volume ($V_s$) interrogated by the detection coil (filling factor), the magnetization per unit volume ($M_o$), and the strength of the radiofrequency ("RF") field ($B_1$) per unit current, and inversely proportional to the square root of the coil resistance (R):

$$\text{Signal} \propto (V_s \times M_o \times B_1)/\sqrt{R}$$

Signal-to-noise can be maximized by decreasing the coil radius, and matching the coil inner diameter as close to the size of the sample as possible. Inadequate filling factor will generally be an issue when standard radiofrequency NMR coils are used to detect signal from very small sample volumes, e.g., from a microcolumn or other miniaturized sample preparation technology. Reduction in the size of NMR radiofrequency coils to the diameter of the fused glass capillary used for these types of separations, has allowed detection of signal from nanoliter volumes from on-line capillary electrophoretic separations Wu et al. (1994a), supra; Olson et al. (1995), supra; Wu et al. (1994b), supra; Wu et al. (1995), supra.

A solenoid microcoil detection cell formed from a fused silica capillary wrapped with copper wire has been used for static measurements of sucrose, arginine and other simple compounds. Wu et al. (1994a), supra; Olson et al. (1995), supra. Coil diameter has been further reduced by the use of conventional micro-electronic techniques in which planar gold or aluminum R.F. coils having a diameter ranging from 10–200 μm were etched in silicon dioxide using standard photolithography. Peck (1995) *J. Magn. Reson.* 108(B) 114–124. The signal-to-noise ratio (SNR) of these planar micro-coils for analyzing solid samples, e.g., silicon rubber was increased by a factor of 10 over other coils. For significant advancement in hyphenating NMR with LC or CE methods, an approach allowing micromolar or even nanomolar limits of detection is required however.

Factors affecting the limit of detection can also be attributed to bulk susceptibility shifts, which become dominant when the sample volume is of the order of the size of the sample chamber and coil. This is in addition to the coil geometry, resistive losses, sample ionic strength, filling factor and operating temperature considerations previously mentioned. We have constructed susceptibility-matched microcoils using 50 μm copper wire with an inner diameter of 70 μm, and obtained signal in 64 seconds from a 12.5 mM solution of arginine at 400 MHZ, with a signal-to-noise of 6:1. Or, in other words, normalizing these results to 300 MHZ for direct comparison with U.S. Pat. No. 5,654,636, issued Aug. 5, 1997, to Sweedler et al. this yields a signal-to-noise of 3:1 versus 1:1 obtained in Sweedler et al.

In order to obtain signal from nanoliter-volume samples having analyte in the micromolar concentration range, assuming limitations only of currently available field strength (750 MHZ) and a time constraint of observing signal after one minute of acquisition time from 5.4 nl of volume, the following parameters could be optimized: (a) reduce the wall thickness while keeping the sample volume the same increasing the filling factor; (b) increase the "Q" or quality factor of the coil by using a superconducting coil; and/or (c) employ sensitivity enhancement techniques such as decoupling or Nuclear Overhauser Enhancement (NOE), or optical pumping (with $^3$He). The following table provides a comparison of the limitation-of-detection before and after implementation of the above mentioned factors. The numbers below were obtained by converting the theoretical S/N advantage obtained by each method to time saved using the method. One minute was deemed acceptable; 1 hour is shown for comparison purposes.

| Acquisition Duration | Limit of Detection of Analyte (mM) |
| --- | --- |
| 1 minute (before optimization) | 4.2 |
| 1 minute (after optimization) | $8.5 \times 10^{-3}$ |
| 1 hour (after optimization) | $1.05 \times 10^{-3}$ |

These calculations indicate that an integrated system could be constructed with the ability to detect micromolar quantities of analyte contained in nanoliter samples using in-line NMR detection following sample preparation and separation.

While silicon micro-machining has been useful in the fabrication of miniaturized liquid phase analysis systems, improvements have been made to overcome the inherent shortcomings of this technique. For example, U.S. Pat. No. 5,500,071 to Kaltenbach et al., U.S. Pat. No. 5,571,410 to Swedberg et al and U.S. patent application Ser. No. 08/656,281 to Kaltenbach et al., disclose the use of laser ablation to form microstructures in novel polymer substrates. This permits an enhanced symmetry and alignment of structures formed by component parts, enhanced separation capabilities, avoidance of problems with $SiO_2$ chemistry, low-cost manufacturing, the formation of microstructures of any size and geometry, and the incorporation of a detection means for on-column analysis. The advantage of combining miniaturized planar liquid phase analysis systems with on-column NMR detection is clearly advantageous in terms of lower overhead for instrument maintenance, increased speed of analysis, decreased sample and solvent consumption, full automation capabilities, increased detection efficiency, and increased quality of information.

A method and an apparatus for NMR spectroscopy of samples from online separation methods has been described. Sweedler et al., supra. While the problems of susceptibility and signal-to-noise from samples of an online separation apparatus are addressed therein, the method and apparatus described is limited to analysis of simple aqueous solutions. The apparatus includes a capillary channel etched or grooved in a substrate such as glass or polycarbonate and a planar lithographic microcoil. The use of micron-feature devices with integrated sample preparation and detection is not described. Integration of the NMR coil with the separation device eliminates dead volume which increases the dispersion and drastically degrades resolution between the point of chemical separation and detection. The method and apparatus presented in Sweedler et al. uses a conventional NMR spectrometer, such that sample preparation occurs outside of the separation/detection system, and hence a truly integrated solution for sample preparation and detection is lacking.

Accordingly, there is a need in the art to address the current trend to move away from expensive instrumentation in a central lab setting, to a low cost, portable, fast time-to-result hyphenated system, requiring little user knowledge to analyze complex samples. Examples of complex samples include chemical or biochemical species in complex biological matrices, or chemical species in complex samples such as soil, sea water, waste water, sludge found at remediation sites, and the like.

There is yet a need in the art for a miniaturized device that avoids the problems of chemical and pH instability that are typical with $SiO_2$ substrates and has miniaturized liquid sample handling capabilities and on-board sample preparation and NMR detection means.

SUMMARY OF THE INVENTION

Accordingly, it is a primary object of the invention to provide a novel miniaturized separation system with an integrated NMR detection chamber and an NMR rf microcoil detector for on-line NMR analysis of samples separated.

It is another object of the invention to provide a miniaturized total analysis system for liquid phase analysis comprising a miniaturized sample processing device having online separation and detection by NMR for liquid phase analysis.

It is yet another object of the invention to provide an integrated device for sample preparation and NMR detection, to be used with high field, low cost miniaturized magnets.

Additional objects, advantages and novel features of the invention will be set forth in part in the description which follows, and in part will become apparent to those skilled in the art upon examination of the following, or may be learned by practice of the invention.

The present invention is directed to a novel miniaturized total analysis system for liquid phase sample preparation and detection. The system comprises an NMR detection compartment and an NMR rf microcoil detector.

The inventors are not aware of any integrated miniaturized system comprising sample processing including sample pretreatment, separation and NMR detection integrated with an NMR rf microcoil for liquid phase analysis. Accordingly, the invention, as now provided, represents a novel and important advance in liquid phase analysis using miniaturized devices. It has been found by the inventors that the integration of an NMR rf microcoil detector with the processing device as now provided eliminates dead volume between the point of chemical preparation and processing and point of detection, and thereby obviates a common source of artifact and signal acquisition delay encountered with stand-alone processing devices interfaced with an NMR instrument. In addition, on-line analysis with the NMR rf microcoil detector enables a faster time-to-result and analysis with increased sensitivity of detection.

In one embodiment of the invention, a miniaturized total analysis system for liquid phase sample processing and detection is provided. The system comprises:

a microfabricated support body having first and second substantially planar opposing surfaces wherein the support body has a microchannel microfabricated in the first planar surface;

a cover plate arranged over the first planar surface, wherein the cover plate in combination with the first microchannel forms a sample processing compartment;

an inlet port and an outlet port communicating with the sample processing compartment, wherein the inlet and outlet ports enable downstream passage of fluid from an external source through the sample processing compartment; and downstream from the sample processing compartment and in fluid communication therewith, an NMR detection compartment around which is an NMR rf microcoil.

In another embodiment of the invention, a miniaturized total analysis system is provided comprising:

a microfabricated support body having first and second component halves each having substantially planar opposing interior and exterior surfaces;

a first microchannel microfabricated in the interior surface of the first support body half and a second microchannel microfabricated in the interior surface of the second support body half, wherein each of the microchannels is so arranged as to provide the mirror image of the other;

an elongate bore formed by aligning the interior surfaces of the support body halves in facing abutment with each other whereby the microchannels define the elongate bore;

an inlet port and an outlet port communicating with the elongate bore, the ports enabling the downstream passage of fluid from an external source through the elongate bore; and downstream from the elongate bore and in fluid communication therewith, an NMR detection compartment around which is an NMR rf microcoil. The NMR detection compartment and the NMR rf microcoil may be fabricated directly in the support body at the point of detection. Alternatively, the NMR detection compartment and the NMR rf microcoil are formed in an insertable modular structure.

In yet another embodiment, the elongate bore comprises a sample processing compartment.

In still a further embodiment, an integrated system for sample preparation and NMR detection is provided comprising the aforementioned miniaturized total analysis system.

The system comprises microchannels and chambers for sample preparation, separation and detection. For example, a biological sample such as blood, urine, milk, cell or tissue extract, fermentation product or the like is added directly to the planar device. The sample is then prepared as required for the particular separation process to be performed, i.e., filtration, solid phase extraction, capillary electrophoresis or liquid chromatography. The prepared sample is then shunted to a separation chamber, and immediately following separation, detected in an NMR detection chamber. The NMR detection chamber has an integrated NMR radiofrequency coil embedded directly in the support media. Following detection, the sample can be discarded or, optionally, transported on chip to a further analytical station. The total analysis would require less than 1 $\mu$L of sample.

The integrated system therefore, provides on-device sample preparation, separation and detection, as well as a transport medium for further analysis if required, an important feature when sample volumes of less than 1 $\mu$L are to be handled. The miniaturized separation device can be formed from a polymer support body having essentially planar halves with microchannels and apertures fabricated therein. When aligned, the two halves define a separation compartment having inlet and outlet ports, an NMR detection chamber and an NMR radiofrequency coil.

In yet another embodiment, an integrated device for sample preparation and NMR detection is provided. The device comprises the aforementioned miniaturized total analysis system and a magnet configured to accept the a miniaturized total analysis system, wherein the device is capable of generating an NMR spectrum. The integrated device with NMR micro-coil is positioned within the center of the homogeneous field of the magnet, which is comprised of: (1) a miniature, e.g., table-top, magnet, such as is currently manufactured by American Magnetics Corp, of field strength of at least 300 MHZ to 750 MHZ; (2) associated electronics and data acquisition and storage capabilities for acquisition of, display and storage of multinuclear NMR spectra acquired from the rf microcoil; and (3) appropriate shielding of the NMR magnet so that the ensemble, i.e., the liquid phase analysis device, the NMR micromagnet and associated peripherals, can be situated easily on a table top or counter.

In a further embodiment, the aforementioned ensemble is small enough to occupy a significantly reduced footprint, and provide a sample in-answer out solution for a nonexpert user. With a significantly reduced footprint, there is also the potential for portability outside the standard laboratory setting. Such technology could easily fit, but is not limited to, the following settings: 1) process control areas in the food industry; 2) in the pharmaceutical industry, e.g., drug metabolism and pharmacokinetic studies, bioavailability, quality or production; 3) in medicine, e.g., near-patient setting, intensive care unit, ambulance or ambulatory care; 4) a variety of service laboratories, e.g., veterinary, farm, agriculture, toxicology or pathology laboratory; 5) for assessing environmental quality, e.g., water treatment site or toxic waste remediation site; and 6) in the petrochemical industry, e.g., a well log site.

In still another embodiment, the micro-magnet, and miniaturized device for processing and NMR detection can be coupled with commercially available sample preparation or separation devices in which the micro-magnet coupled with the planar NMR detection device functions primarily as a liquid handling device for very small sample volumes. The sample treatment chamber in the miniaturized sample-processing device can be used to mix in NMR active labels for selective detection in the NMR detection chamber. Following NMR detection the micro-analysis system can then be used to transport the sample following NMR detection, to another detection or analysis method, such as MS.

It is a further related object of the present invention to provide a device featuring improved means for liquid handling, including sample injection.

A particular advantage of the present invention is the use of processes other than silicon micromachining techniques or etching techniques to create miniaturized columns in a wide variety of polymeric, ceramic, glass, metal and composite substrates having desirable attributes for an analysis portion of a separation system. More specifically, it is contemplated herein to provide a miniaturized total analysis system prepared by ablating, molding or embossing component microstructures in a substrate using techniques well known in the art. In one preferred embodiment, a miniaturized total analysis system is formed by providing two substantially planar halves having microstructures microfabricated thereon, which, when the two halves are folded upon each other, define a sample processing compartment featuring enhanced symmetry and axial alignment.

Use of microfabrication techniques, e.g., laser ablation, to form a miniaturized total analysis system according to the present invention affords several advantages over prior etching and micromachining techniques used to form systems in silicon or silicon dioxide materials. Initially, the capability of applying rigid computerized control over such processes allows microstructure formation to be executed with great precision, thereby enabling a heightened degree of alignment in structures formed by component parts. For example, laser ablation processes avoid problems encountered with microlithographic isotropic etching techniques which may undercut masking during etching, giving rise to asymmetrical structures having curved side walls and flat bottoms.

Microfabrication, in particular, laser ablation, enables the production of microstructures with greatly reduced component size. In this regard, microstructures formed as described herein are capable of having aspect ratios several orders of magnitude higher than possible using prior etching techniques, thereby providing enhanced sample processing capabilities in such devices. For example, the use of laser-ablation processes to form microstructures in substrates such as polymers increases ease of fabrication and lowers per-unit manufacturing costs in the subject devices as compared to prior approaches such as micromachining devices in silicon. In this regard, devices formed according to the invention in low-cost substrates have the added feature of being capable of use as substantially disposable miniaturized analysis units.

Laser ablation or other microfabrication techniques used in a planar substrate allows for formation of microstructures of almost any geometry or shape. This feature not only enables the formation of complex device configurations, but further allows for integration of sample injection, sample preparation, pre- or post-separation chemical modification and a variety of detection means, in particular, an NMR detection means, in a miniaturized total analysis system of greatly reduced overall dimensions.

The integrated device disclosed and claimed herein can be interfaced with a very high field, homogeneous volume, small, low-cost table-top magnet. This apparatus provides a small footprint, completely integrated, potentially mobile, system, for liquid phase analysis of biological samples.

By the present invention, inherent weaknesses existing in prior approaches to liquid phase separation device miniaturization, and problems in using silicon micromachining techniques to form miniaturized column devices have been addressed. Accordingly, the present invention discloses a miniaturized total analysis system capable of performing a variety of liquid phase analyses on a wide array of liquid samples.

BRIEF DESCRIPTION OF THE DRAWINGS

In the course of this description, reference will be made to the attached drawings, wherein like parts denote like parts throughout and wherein:

FIG. 20 is a plan view of a miniaturized column device having an alternative sample introduction means ablated in a planar substrate.

FIG. 21 is a plan view of the miniaturized column device of FIG. 20 having a cover plate aligned over the planar substrate.

FIG. 24 is a pictorial representation of a miniaturized total analysis system with an NMR detection compartment and an NMR rf microcoil. FIG. 24B illustrates a miniaturized total analysis system in which the NMR detection compartment and the NMR rf microcoil are components of a modular structure removably insertable into the support body. In addition, FIG. 24A schematically illustrates a separation device with on-board transmit-receive circuitry, while FIG. 24B illustrates the device with on-board receive-only circuitry.

DETAILED DESCRIPTION OF THE INVENTION

Figure 1:
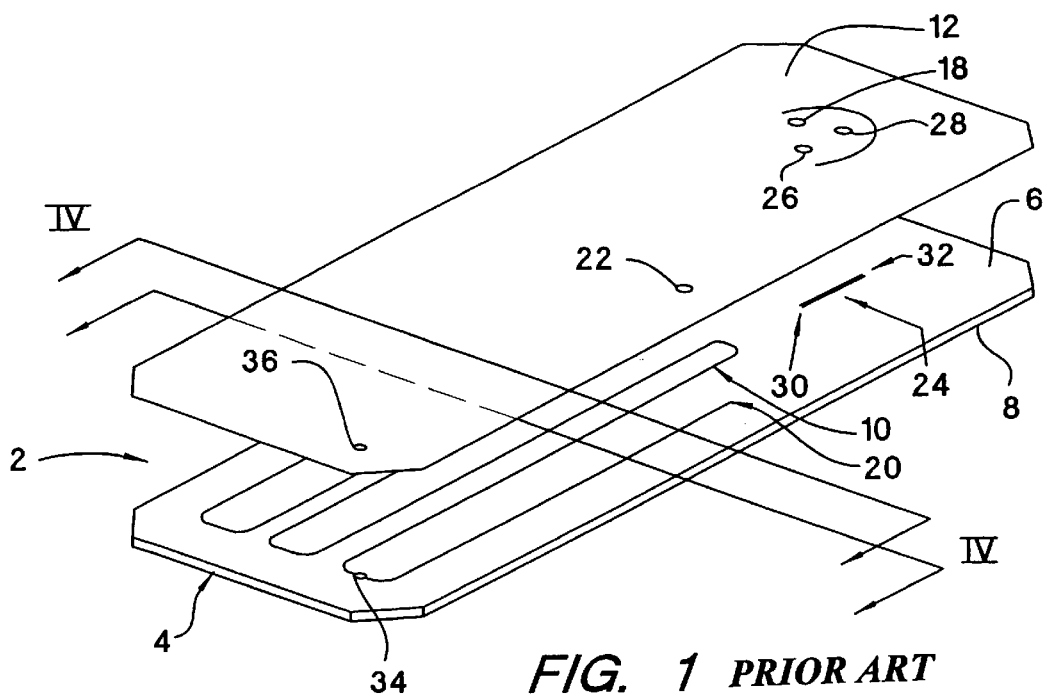
FIG. 1 (prior art) is an exploded view of a miniaturized column device constructed in accordance with the present invention.

Before the invention is described in detail, it is to be understood that this invention is not limited to the particular component parts of the devices described or process steps of the methods described as such devices and methods may vary. It is also to be understood that the terminology used herein is for purposes of describing particular embodiments only, and is not intended to be limiting. It must be noted that, as used in the specification and the appended claims, the singular forms "a," "an" and "the" include plural referents unless the context clearly dictates otherwise. Thus, for example, reference to "an analyte" includes mixtures of analytes, reference to "a detection means" includes two or more such detection means, reference to "a sample processing compartment" includes more than one such compartment, reference to "an NMR rf microcoil" includes two or more such microcoils, and the like.

In this specification and in the claims which follow, reference will be made to a number of terms which shall be defined to have the following meanings:

The term "substrate" and "support body" are used interchangeably herein to refer to any material which can be microfabricated, e.g., ablated, molded or embossed, to have desired miniaturized surface features. The substrate can be a polymer, a ceramic, a glass, a metal, a composite thereof, a laminate thereof, or the like. A "composite" is a composition comprised of unlike materials. The composite may be a block composite, e.g., an A-B-A block composite, an A-B-C block composite, or the like. Alternatively, the composite may be a heterogeneous, i.e., in which the materials are distinct or in separate phases, or homogeneous combination of unlike materials. As used herein, the term "composite" is used to include a "laminate" composite. A "laminate" refers to a composite material formed from several different bonded layers of same or different materials.

Accordingly, in one embodiment, integrated miniaturized processing devices are formed herein using suitable substrates, such as laser ablatable polymers (including polyimides and the like) and ceramics (including aluminum oxides and the like), as well as glass and metal substrates. Further, miniaturized column devices can be formed using a composite substrate. One particularly preferred composite substrate comprises a polyimide laminate formed from a first layer of polyimide, such as Kapton® (DuPont; Wilmington, Del.), that has been co-extruded with a second, thin layer of a thermal adhesive form of polyimide known as KJ® (DuPont). This thermoplastic adhesive can be applied to one or both sides of the first polyimide layer, thereby providing a means for producing a laminate of desired thickness. Other preferred composite substrates include a polymer-metal laminates, e.g., polyimide coated with copper, a ceramic-in-metal or a polymer-in-metal composite.

The term "sample processing compartment" is used herein to refer to a region of the support in which sample handling is carried out. Sample handling includes the entire range of operations capable of being performed on the sample from its introduction into the compartment until its removal for use. Thus, sample processing includes operations that effect sample preparation and/or sample separation. Such operations may include but are not limited to: concentration of a sample from a dilute solution; chemical modifications of sample components; chromatographic and/or electrophoretic separation of sample components; removal of interfering molecules and ions; and the like. The sample processing compartment frequently will include one or more access ports for introducing materials into, and withdrawing materials from the compartment (e.g., sample, fluids and reagents).

The term "sample flow channel" is used herein to refer to the flow path extending from the first end of the sample processing compartment of the miniaturized separation device to the second end thereof.

The term "sample handling region" refers to a portion of a microchannel, or to a portion of a "sample processing compartment" that is formed upon enclosure of the microchannel by a cover plate or substrate in which a mirror image of the microchannel has been microfabricated as described below, that includes a "sample flow component" or a "sample treatment component." By the term "sample flow component" is intended a portion of the sample processing compartment that interconnects sample treatment components.

A "sample treatment component" is a portion of the sample processing compartment in which particular sample preparation chemistries are done. In particular, an analyte of interest is generally obtained in a matrix containing other species which may potentially interfere with the detection and analysis of the analyte. Accordingly, a sample treatment component is a portion of the sample processing compartment in which analyte separation from the matrix is effected. Examples of functions which may be served by the sample treatment component include chromatographic separations, electrophoretic separations, electro-chromatographic separations, and the like.

As "detection means" is intended to include any means, structure or configuration that allows the interrogation of a sample within a sample processing compartment using analytical detection means well known in the art. Thus, a detection means includes one or more apertures, elongated apertures or grooves that communicate with the sample processing compartment and allow an external detection apparatus or device to be interfaced with the sample processing compartment to detect an analyte passing through the compartment.

As used herein, the term "NMR rf detector" or "NMR detection means" refers to any means, structure or configuration which allows one to interrogate a sample within an on-device NMR microcoil using an external magnet. Thus, an NMR detection means an NMR microcoil that communicates with the sample processing compartment and allows an external magnet to be interfaced with the sample processing compartment to detect an analyte passing through the compartment.

An "optical detection path" refers to a configuration or arrangement of detection means to form a path whereby radiation, such as a ray of light, is able to travel from an external source to a means for receiving radiation--wherein the radiation traverses the sample processing compartment and can be influenced by the sample or separated analytes in the sample flowing through the sample processing compartment. An optical detection path is generally formed according to the invention by positioning a pair of detection means directly opposite each other relative to the sample processing compartment. In this configuration, analytes passing through the sample processing compartment can be detected via transmission of radiation orthogonal to the major axis of the sample processing compartment (and, accordingly, orthogonal to the direction of electro-osmotic flow in an electrophoretic separation). A variety of external optical detection techniques can be readily interfaced with the sample processing compartment using an optical detection path including, but not limited to, UV/Vis, Near IR, fluorescence, refractive index (RI) and Raman techniques.

As used herein, a "lightguide means" refers to a substantially long, thin thread of a transparent substance which can be used to transmit light. Lightguide means useful in the practice of the invention include optical fibers, integrated lens configurations and the like. In particularly preferred embodiments, optical fibers are interfaced with detection means to enable optical detection techniques known in the art. The terms "optical fiber," "fiber optic waveguide" or "optical fiber means" are used herein to refer to a single optical fiber or a bundle optical fibers, optionally encased in a protective cladding material. Examples of suitable optical fiber substrate materials include glass, plastic, glass/glass composite and glass/plastic composite fibers. A critical characteristic of optical fibers is attenuation of an optical signal. Further, a chemical sensor can be incorporated into a fiber optic waveguide in a manner such that the chemical sensor will interact with the liquid sample analyte. Structures, properties, functions and operational details of such fiber optic chemical sensors can be found in U.S. Pat. No. 4,577,109 to Hirschfeld, U.S. Pat. No. 4,785,814 to Kane, and U.S. Pat. No. 4,842,783 to Blaylock.

The use of microfabrication techniques such as, but not limited to, laser ablation, molding and embossing, in the practice of the invention allows for a high degree of precision in the alignment of micro-scale components and structures, which alignment has either been difficult or not possible in prior substrate-based devices. Thus, the term "microalignment" as used herein refers to the precise and accurate alignment of microfabricated features, including the enhanced alignment of complementary microchannels or microcompartments with each other, inlet and/or outlet ports with microchannels or separation compartments, detection means with microchannels or separation compartments, detection means with other detection means, and the like.

The term "microalignment means" is defined herein to refer to any means for ensuring the precise microalignment of microfabricated features in a miniaturized column device. Microalignment means can be formed in the column devices either by laser ablation or by other methods of fabricating shaped pieces well known in the art. Representative microalignment means that can be employed herein include a plurality of co-axially arranged apertures microfabricated in component parts and/or a plurality of corresponding features in column device substrates, e.g., projections and mating depressions, grooves and mating ridges or the like. Alternative alignment means includes features forms in component parts such as pin and mating aperture. Further, the accurate microalignment of component parts can be effected by forming the miniaturized columns in flexible substrates having at least one fold means microfabricated therein, such that sections of the substrate can be folded to overlie other sections thereby forming composite micro-scale compartments, aligning features such as apertures or detection means with separation compartments, or forming micro-scale separation compartments from microchannels. Such fold means can be embodied by a row of spaced-apart perforations fabricated in a particular substrate, a contiguous slot-like depression or a series spaced-apart slot-like depressions or apertures microfabricated in the substrate so as to extend only part way therethrough, or the like. The perforations or depressions can have circular, diamond, hexagonal or other shapes that promote hinge formation along a predetermined straight line.

The term "liquid phase analysis" is used to refer to any analysis which is done on either small and/or macromolecular solutes in the liquid phase. Accordingly, "liquid phase analysis" as used herein includes chromatographic separations, electrophoretic separations, and electrochromatographic separations.

In this regard, "chromatographic" processes generally comprise preferential separations of components, and include reverse-phase, hydrophobic interaction, ion exchange, molecular sieve chromatography and like methods.

"Electrophoretic" separations refers to the migration of particles or macromolecules having a net electric charge where said migration is influenced by an electric field. Accordingly electrophoretic separations contemplated for use in the invention include separations performed in columns packed with gels (such as poly-acrylamide, agarose and combinations thereof) as well as separations performed in solution.

"Electrochromatographic" separations refer to combinations of electrophoretic and chromatographic techniques.

The term "motive force" is used to refer to any means for inducing movement of a sample along a column in a liquid phase analysis, and includes application of an electric potential across any portion of the column, application of a pressure differential across any portion of the column or any combination thereof.

The term "surface treatment" is used to refer to preparation or modification of the surface of a microchannel which will be in contact with a sample during separation, whereby the separation characteristics of the device are altered or otherwise enhanced. Accordingly, "surface treatment" as used herein includes: physical surface adsorptions; covalent bonding of selected moieties to functional groups on the surface of microchannel substrates (such as to amine, hydroxyl or carboxylic acid groups on condensation polymers); methods of coating surfaces, including dynamic deactivation of channel surfaces (such as by adding surfactants to media), polymer grafting to the surface of channel substrates (such as polystyrene or divinyl-benzene), sputter deposition of metallic materials and thin-film deposition of materials such as diamond or sapphire to microchannel substrates.

The term "laser ablation" is used to refer to a machining process using a high-energy photon laser such as an excimer laser to ablate features in a suitable substrate. The excimer laser can be, for example, of the $F_2$, ArF, KrCl, KrF, or XeCl type.

The microstructures in the miniaturized separation device of the invention, e.g., sample processing compartments, injection means, detection means and micro-alignment means, may be formed by microfabrication in a support body such as a polymeric, ceramic, glass, metal or composite substrate. For example, laser ablation techniques can be used with any UV-absorbing material such as a polymer or ceramic material (see U.S. Pat. Nos. 5,500,071 and 5,571,410).

In general, with respect to laser ablation, any substrate which is UV absorbing provides a suitable substrate for the support body. The support body may comprise a substantially planar substrate such as a polyimide film which is both laser ablatable and flexible so as to enable folding after ablation; however, the particular substrate selected or microfabrication technique is not considered to be limiting in the invention. Accordingly, microstructures of selected configurations can be formed by imaging a lithographic mask onto a suitable substrate, such as a polymer or ceramic material, and then laser ablating the substrate with laser light in areas that are unprotected by the lithographic mask.

In laser ablation, short pulses of intense ultraviolet light are absorbed in a thin surface layer of material within about 1 $\mu$m or less of the surface. Preferred pulse energies are greater than about 100 millijoules per square centimeter and pulse durations are shorter than about 1 microsecond. Under these conditions, the intense ultraviolet light photodissociates the chemical bonds in the material. Furthermore, the absorbed ultraviolet energy is concentrated in such a small volume of material that it rapidly heats the dissociated fragments and ejects them away from the surface of the material. Because these processes occur so quickly, there is no time for heat to propagate to the surrounding material. As a result, the surrounding region is not melted or otherwise damaged, and the perimeter of ablated features can replicate the shape of the incident optical beam with precision on the scale of about one micrometer.

Although laser ablation has been described herein using an excimer laser, it is to be understood that other ultraviolet light sources with substantially the same optical wavelength and energy density may be used to accomplish the ablation process. Preferably, the wavelength of such an ultraviolet light source will lie in the 150 nm to 400 nm range to allow high absorption in the substrate to be ablated. Furthermore, the energy density should be greater than about 100 millijoules per square centimeter with a pulse length shorter than about 1 microsecond to achieve rapid ejection of ablated material with essentially no heating of the surrounding remaining material. Laser ablation techniques, such as those described above, have been described in the art. Znotins et al., Laser Focus Electro Optics, (1987) pp. 54–70; U.S. Pat. Nos. 5,291,226 and 5,305,015 to Schantz et al.

A frequency multiplied YAG laser can also be used in place of the excimer laser. In such a case, a complex microstructure pattern useful for practicing the invention can be formed on a suitable polymeric or ceramic substrate by combining a masking process with a laser ablation means, such as in a step-and-repeat process, where such processes would be readily understood by one of ordinary skill in the art.

The term "injection molding" is used to refer to a process for molding plastic or nonplastic ceramic shapes by injecting a measured quantity of a molten plastic or ceramic substrate into dies (or molds). In one embodiment of the present invention, miniaturized column devices may be produced using injection molding.

More particularly, it is contemplated to form a mold or die of a miniaturized column device wherein excimer laser-ablation or other microfabrication technique is used to define an original microstructure pattern in a suitable polymer substrate. The microstructure thus formed may then be coated by a very thin metal layer and electroplated (such as by galvano forming) with a metal such as nickel to provide a carrier. When the metal carrier is separated from the original polymer, a mold insert (or tooling) is provided having the negative structure of the polymer. Accordingly, multiple replicas of the microstructure pattern may be made in suitable substrates using injection molding techniques well known in the art.

The term "LIGA process" is used to refer to a process for fabricating microstructures having high aspect ratios and increased structural precision using synchrotron radiation lithography, galvanoforming, and plastic molding. In a LIGA process, radiation sensitive plastics are lithographically irradiated at high energy radiation using a synchrotron source to create desired microstructures (such as channels, ports, apertures and micro-alignment means), thereby forming a primary template.

The primary template is then filled with a metal by electrodeposition techniques. The metal structure thus formed comprises a mold insert for the fabrication of secondary plastic templates which take the place of the primary template. In this manner highly accurate replicas of the original microstructures may be formed in a variety of substrates using injection or reactive injection molding techniques. The LIGA process has been described by Becker, E. W., et al., Microelectric Engineering (1986) 4:35–56. Descriptions of numerous polymer substrates which may be injection molded using LIGA templates, and which are suitable substrates in the practice of the subject invention, may be found in "Contemporary Polymer Chemistry", Allcock, H. R. and Lampe, F. W. (Prentice-Hall, Inc.) New Jersey (1981).

The term "mass sensitivity" is used herein to refer to the mass limit of detection.

The term "NMR rf coil" is used herein to refer to a radiofrequency resonator producing a magnetic field ($B_1$) orthogonal to the main magnetic field ($B_0$).

The term "NMR rf microcoil" is used herein to refer to an NMR rf coil having a cross-sectional area less than 1 mm$^2$.

The term "susceptibility" is used herein to refer to the ratio of magnetization of a material to the magnetic field strength. Magnetic susceptibility differences between the sample to be analyzed and other diamagnetic materials interposed between the sample and magnetic field can introduce magnetic field inhomogeneities, and result in broadened spectral lines. Susceptibility differences can be reduced by matching the magnetic susceptibility of the medium surrounding the sample to that of the coil material, e.g., by surrounding the coil and coil-NMR detection chamber interface with susceptibility matching fluids such as Fluorinert®, a perfluorinated organic liquid (3M, St. Paul, Minn.).

The term "NMR detection chamber" is used herein to refer to a sample detection chamber where resonant nuclei are interrogated by the radiofrequency coil.

The term "coil filling factor" refers to the ratio of the inner diameter of the capillary to the diameter of the coil surrounding it. The coil filling factor reflects the number of nuclei per unit volume that can be interrogated by the radiofrequency pulse. The signal is proportional to the number of resonant nuclei per unit volume, hence for a given coil diameter, a thinner walled chamber will allow more nuclei to be interrogated than in a thick walled chamber.

The term "multiple receive coils" refers to two or more receive coils, mutually decoupled, each feeding a separate receive chain, with signal summed after reception.

"Optional" or "optionally" means that the subsequently described feature or structure may or may not be present in the integrated planar separation device or that the subsequently described event or circumstance may or may not occur, and that the description includes instances where said feature or structure is present and instances where the feature or structure is absent, or instances where the event or circumstance occurs and instances where it does not. For example, the phrase "an integrated separation device optionally having detection means" intends that access ports may or may not be present on the device and that the description includes both circumstances where access ports are present and absent.

Accordingly, the invention concerns formation of integrated miniaturized sample processing devices including NMR detection means using microfabrication techniques in a suitable substrate. It is also contemplated to form sample processing devices and NMR detection means according to the invention using injection molding techniques wherein the original microstructure has been formed by an excimer laser ablation process, or where the original microstructure has been formed using a LIGA process.

A preferred substrate for practicing this invention using laser ablation comprises a polyimide material such as those available under the trademarks Kapton® or Upilex® from DuPont (Wilmington, Del.), although the particular substrate selected may comprise any other suitable polymer or ceramic substrate. Polymer materials particularly contemplated herein include materials selected from the following classes: polyimide, polycarbonate, polyester, polyamide, polyether, polyolefin, or mixtures thereof. Further, the polymer material selected may be produced in long strips on a reel, and, optional sprocket holes along the sides of the material may be provided to accurately and securely transport the substrate through a step-and-repeat process.

According to the invention, the selected polymer material is transported to a laser processing chamber and laser-ablated in a pattern defined by one or more masks using laser radiation. In a preferred embodiment, such masks define all of the ablated features for an extended area of the material, for example encompassing multiple apertures (including inlet and outlet ports), micro-alignment means and sample processing chambers.

Alternatively, patterns such as the aperture pattern, the sample processing channel pattern, etc., may be placed side by side on a common mask substrate which is substantially larger than the laser beam. Such patterns may then be moved sequentially into the beam. In other contemplated production methods, one or more masks may be used to form apertures through the substrate, and another mask and laser energy level (and/or number of laser shots) may be used to define sample processing channels which are only formed through a portion of the thickness of the substrate. The masking material used in such masks will preferably be highly reflecting at the laser wavelength, consisting of, for example, a multilayer dielectric material or a metal such as aluminum.

The laser ablation system employed in the invention generally includes beam delivery optics, alignment optics, a high precision and high speed mask shuttle system, and a processing chamber including mechanism for handling and positioning the material. In a preferred embodiment, the laser system uses a projection mask configuration wherein a precision lens interposed between the mask and the substrate projects the excimer laser light onto the substrate in the image of the pattern defined on the mask.

It will be readily apparent to one of ordinary skill in the art that microfabrication techniques may be used to form miniaturized sample processing channels and apertures in a wide variety of geometries. For example, any geometry that does not include undercutting may be provided using ablation techniques, such as modulation of laser light intensity across the substrate, stepping the beam across the surface or stepping the fluence and number of pulses applied to each location to control corresponding depth. Further, channels or chambers produced according to the invention are easily fabricated having ratios of channel depth to channel width which are much greater than previously possible using etching techniques such as silicon micromachining. Such aspect ratios can easily exceed unity, and may even reach to 10. Furthermore, the aspect ratio of, e.g., laser-ablated channels and chambers can be less than one, i.e., the width of the channel or chamber can be greater than the depth.

In a preferred embodiment of the invention, channels of a semi-circular cross section are laser ablated by controlling exposure intensity or by making multiple exposures with the beam being reoriented between each exposure. Accordingly, when a corresponding semi-circular channel is aligned with a channel thus formed, a sample processing chamber of highly symmetrical circular cross-section is defined which may be desirable for enhanced fluid flow through the sample processing device.

As a final step in laser ablation processes, a cleaning step is performed wherein the laser-ablated portion of the substrate is positioned under a cleaning station. At the cleaning station, debris from the laser ablation are removed according to standard industry practice.

As will be appreciated by those working in the field of liquid phase analysis devices, the above-described method may be used to produce a wide variety of miniaturized devices. One such device is represented in FIG. 1 where a particular embodiment of a miniaturized column device is generally indicated at 2. Generally, miniaturized column 2 is formed in a selected substrate 4 using laser ablation techniques. The substrate 4 generally comprises first and second substantially planar opposing surfaces indicated at 6 and 8 respectively, and is selected from a material other than silicon which is UV absorbing and, accordingly, laser-ablatable.

In a particular embodiment of the invention, the miniaturized column device 2 comprises a column structure ablated on a chip, which, in the practice of the invention may be a machinable form of the plastic polyimide such as Vespel®. It is particularly contemplated in the invention to use such a polyimide substrate as, based on considerable experience with the shortcomings of fused silica and research into alternatives thereof, polyimides have proved to be a highly desirable substrate material for the analysis portion of a liquid phase sample processing system.

In this regard, it has been demonstrated that polyimides exhibit low sorptive properties towards proteins, which are known to be particularly difficult to analyze in prior silicon dioxide-based separation systems. Successful demonstrations of separations with this difficult class of solutes typically ensures that separation of other classes of solutes will be not be problematic. Further, since polyimide is a condensation polymer, it is possible to chemically bond groups to the surface which may provide a variety of desirable surface properties, depending on the target analysis. Unlike prior silicon dioxide based systems, these bonds to the polymeric substrate demonstrate pH stability in the basic region (pH 9–10).

Figure 2:
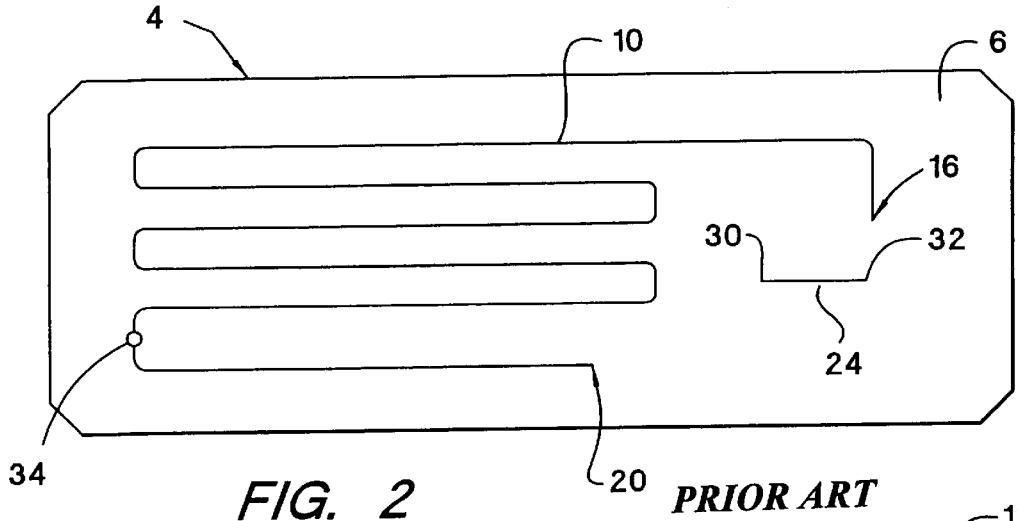
FIG. 2 (prior art) is a plan view of the interior surface of the miniaturized column device of FIG. 1.
Figure 3:
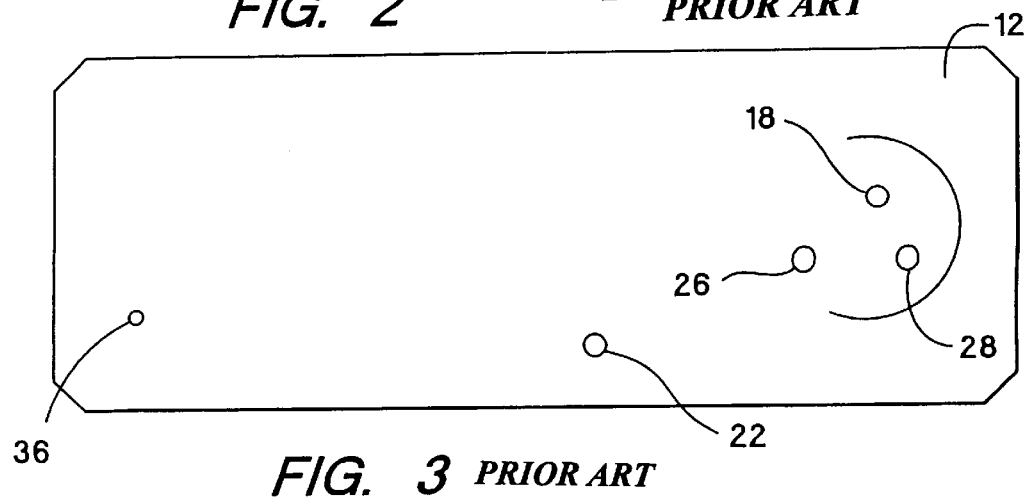
FIG. 3 (prior art) is a plan view of the exterior surface of the device of FIG. 1.

Referring now to FIGS. 1–3, the substrate 4 has a microchannel 10 laser-ablated in a first planar surface 6. It will be readily appreciated that, although the microchannel 10 has been represented in a generally extended form, microchannels formed according to the invention may be ablated in a large variety of configurations, such as in a straight, serpentine, spiral, or any tortuous path desired. Further, as described in greater detail above, the microchannel 10 may be formed in a wide variety of channel geometries including semi-circular, rectangular, rhomboid, and the like, and the channels may be formed in a wide range of aspect ratios. It is also noted that a device having a plurality of microchannels laser-ablated thereon falls within the spirit of the present invention.

Figure 4:
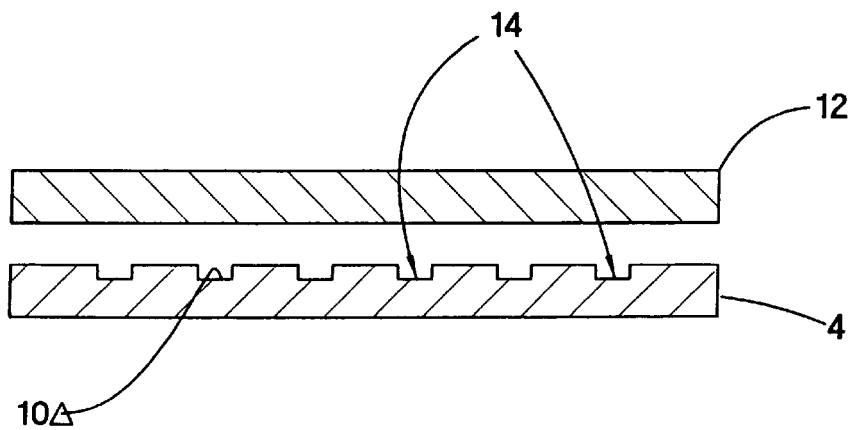
FIG. 4 (prior art) is a cross-sectional side view of the miniaturized column device of FIG. 1, taken along lines IV—IV and showing formation of a sample processing compartment according to the invention.

Referring particularly to FIGS. 1 and 4, a cover plate 12 is arranged over said first planar surface 6 and, in combination with the laser-ablated microchannel 10, forms an elongate sample processing compartment 14. Cover plate 12 may be formed from any suitable substrate such as polyimide, the selection of the substrate only being limited by avoidance of undesirable separation surfaces such as silicon or silicon dioxide materials.

According to the invention, cover plate 12 may be fixably aligned over the first planar surface 6 to form a liquid-tight sample processing compartment by using pressure sealing techniques, by using external means to urge the pieces together (such as clips, tension springs or associated clamping apparatus) or by using adhesives well known in the art of bonding polymers, ceramics and the like.

Referring to FIGS. 1–4, a particular embodiment of the invention is shown wherein cover plate 12 further comprises apertures ablated therein. In this regard, a first aperture communicates with the sample processing compartment 14 at a first end 16 thereof to form an inlet port 18 enabling the passage of fluid from an external source into said sample processing compartment. A second aperture communicates with the sample processing compartment 14 at a second end 20 thereof to form an outlet port 22 enabling passage of fluid from the sample processing compartment to an external receptacle. Accordingly, a miniaturized column device is formed having a flow path extending from the first end 16 of the sample processing compartment and passing to the second end 20 thereof, whereby liquid phase analysis of samples may be carried out using techniques well known in the art.

Referring still to FIGS. 1–4, a particular embodiment of the invention is shown comprising sample introduction means laser-ablated into both the substrate 4 and cover plate 12. An internally ablated by-pass channel 24 is formed in substrate 4, said channel 24 being disposed near the first end 16 of the sample processing compartment. Two additional apertures 26 and 28 are formed in cover plate 12 and are arranged to cooperate with first and second ends (indicated at 30 and 32 respectively) of the by-pass channel 24. In this manner, a sample being held in an external reservoir may be introduced into by-pass channel 24 to form a sample plug of a known volume (defined by the dimensions of the channel 24). The sample plug thus formed may then be introduced into the first end 16 of the sample processing compartment 14 via inlet port 18 by communicating external mechanical valving with said inlet port and laser-ablated apertures 26 and 28 and flushing solution through the by-pass channel 24 into the sample processing compartment.

It is noted that the ablated by-pass channel 24 and apertures 26 and 28 further enable a wide variety of sample introduction techniques to be practiced according to the invention. Particularly, having a by-pass channel which is not connected to the sample processing compartment allows a user to flush a sample through the by-pass channel without experiencing sample carry-over or column contamination. As will be appreciated by one of ordinary skill in the art after reading this specification, one such sample introduction technique may be effected by butt-coupling an associated rotor to a stator (not shown) on the external surface of a miniaturized column where the rotor selectively interfaces external tubing and fluid sources with inlet port 18 and apertures 26 and 28, allowing a sample to be flushed from the by-pass channel 24 into external tubing from which the sample may then be introduced into the column via inlet port 18 for liquid phase analysis thereof. In this regard, a miniaturized column device formed in a polyimide substrate enables a ceramic rotor, pressed to the device using tensioned force (to form a liquid-tight seal), to still rotate between selected aperture positions on the device due to the friction characteristics of the two materials. Other suitable rotors can be formed in rigid materials such as, but not limited to, glass and non-conductive substrates.

Accordingly, in the practice of the invention, external hardware provides the mechanical valving necessary for communication of a miniaturized column device to different external liquid reservoirs, such as an electrolyte solution, flush solution or the sample via laser-ablated holes designed into the cover plate 12. This feature allows a variety of injection methods to be adapted to a miniaturized planar column device constructed according to the invention, including pressure injection, hydrodynamic injection or electrokinetic injection. In the particular embodiment of FIGS. 1–3, it is contemplated that external valving and injection means communicate with the sample processing device by butt-coupling to the laser-ablated apertures, however, any other suitable methods of connection known in the art may easily be adapted to the invention. Further, it is noted that numerous other sample introduction and fluid interfacing designs may be practiced and still fall within the spirit of the subject invention.

Also according to the invention, a wide variety of means for applying a motive force along the length of the sample processing compartment 14 may be associated with the subject device. In this regard, a pressure differential or electric potential may be applied along the entire length of the sample processing compartment by interfacing motive means with inlet port 18 and outlet port 22.

The use of substrates such as polyimides in the construction of miniaturized columns according to the invention allows the possibility of using refractive-index (RI) detection to detect separated analytes of interest passing through the subject columns. In this regard, the provision of an associated laser diode which emits radiation at a wavelength where polyimide is "transparent" (such as at >500 nm) allows for a detection setup where no additional features need to be ablated in the column devices.

Referring now to FIGS. 2–4, in a preferred embodiment of the invention, detection means may be ablated into the substrate 4 and cover plate 12, where said detection means is disposed substantially downstream of the first end 16 of the sample processing compartment 14. More particularly, an aperture 34 may be ablated through substrate 4 to communicate with the sample processing compartment 14. A corresponding aperture 36 may be likewise formed in cover plate 12, and arranged so that it will be in co-axial alignment with aperture 34 when the cover plate is affixed to the substrate to form the sample processing compartment 14. In this manner, electrodes (not shown) may be connected to the miniaturized column device via the apertures 34 and 36 to detect separated analytes of interest passing through the sample processing compartment by electrochemical detection techniques.

Figure 5:
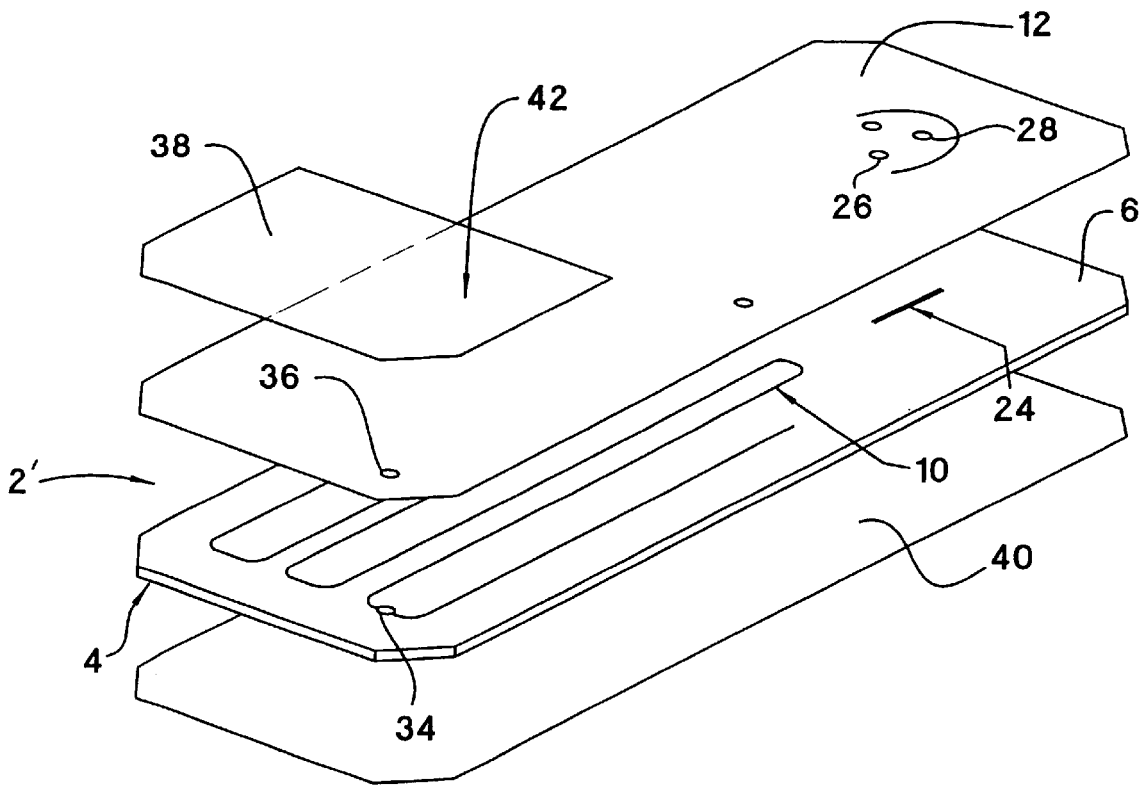
FIG. 5 (prior art) is an exploded view of a preferred embodiment of the present invention including optical detection means.

Referring to FIG. 5, a further embodiment of the invention, indicated at 2' is shown comprising a preferred detection means indicated generally at 42. More particularly, a first transparent sheet 38 is provided wherein the cover plate 12 is interposed between said first transparent sheet and substrate 4. A second transparent sheet 40 is also provided wherein the second sheet is disposed over the second planar surface 8 of the substrate 4. In this manner, detection means 42 allows optical detection of separated analytes passing through sample processing compartment, formed by the combination of microchannel 10 and cover plate 12, via transmission of radiation orthogonal to the major axis of the sample processing compartment (and, accordingly, orthogonal to the direction of electro-osmotic flow in an electrophoretic separation). Further, in the practice of the invention, the transparent sheets may comprise materials such as quartz, diamond, sapphire, fused silica or any other suitable substrate which enables light transmission therethrough.

The subject transparent sheets may be formed with just enough surface area to cover and seal the detection apertures 34 and 36, or said sheets may be sized to cover up to the entire surface area of the column device. In this regard, additional structural rigidity may be provided to a column device formed in a particularly thin substrate film, such as a thin-film polyimide substrate, by employing a substantially co-planar sheet of, for example, fused silica.

Accordingly, the above described optical detection means 42 enables adaptation of a variety of external optical detection means to miniaturized columns constructed according to the invention. Further, sealing of the transparent sheets 38 and 40 to the miniaturized column device 2' is readily enabled, for example, when substrate 4 and cover plate 12 are formed in polyimide materials which include a layer of a thermal adhesive form of polyimide, since it is known that quartz/Kapton® bonds formed using such adhesives are very resilient. Sealing of other preferred transparent sheet materials, such as diamond, sapphire or fused-silica to the subject device may be accomplished using adhesion techniques well known in the art.

The possibility of detecting with radiation over a range of electromagnetic wavelengths offers a variety of spectrophotometric detection techniques to be interfaced with a miniaturized column according to the invention, including UV/Vis, fluorescence, refractive index (RI) and Raman.

Furthermore, as will be readily appreciated, the use of optical detection means comprising apertures ablated into the substrate and cover plate provides great control over the effective detection path length in a miniaturized column device constructed according to the invention. In this regard, the detection path length will be substantially equal to the combined thickness of the substrate 4 and the cover plate 12, and detection path lengths of up to 250 µm are readily obtainable using the subject detection means 42 in thin-film substrates such as polyimides.

Figure 6:
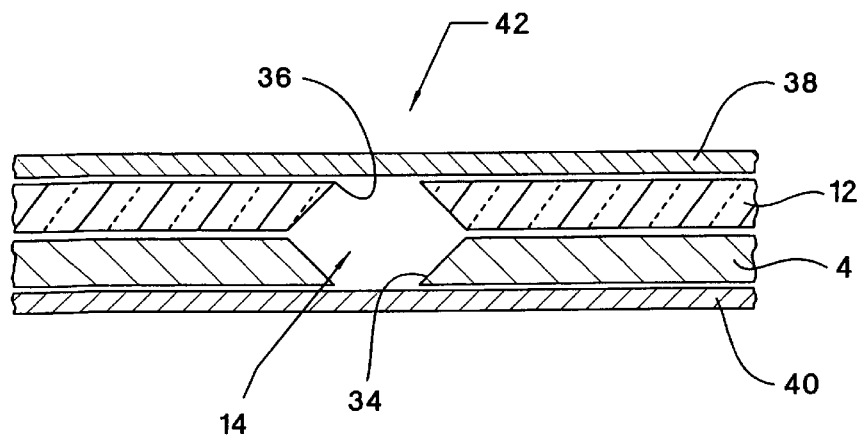
FIG. 6 (prior art) is a cross-sectional axial view of the intersection of the sample processing compartment and the optical detection means in the miniaturized column device of FIG. 5.

Referring now to FIG. 6, it can be seen that apertures 34 and 36 provide an enlarged volume in sample processing compartment 14 at the point of intersection with the detection means 42, where that volume will be proportional to the combined thickness of substrate 4 and cover plate 12. In this manner, sample plugs passing through sample processing compartment 14 may be subject to untoward distortion as the plug is influenced by the increased compartment volume in the detection area, especially where the combined thickness of the substrate and cover plate exceeds about 250 µm, thereby possibly reducing separation efficiency in the device.

Accordingly, in the present invention wherein detection path lengths exceeding 250 µm are desired, an alternative device embodiment is provided having laser-ablated features on two opposing surfaces of a substrate. More particularly, in FIGS. 7A and 7B, a further embodiment of a miniaturized column device is generally indicated at 52. The miniaturized column comprises a substrate 54 having first and second substantially planar opposing surfaces respectively indicated at 56 and 58. The substrate 54 has a first microchannel 60 laser ablated in the first planar surface 56 and a second microchannel 62 laser ablated in the second planar surface 58, wherein the microchannels can be provided in a wide variety of geometries, configurations and aspect ratios as described above.

Figure 7A:
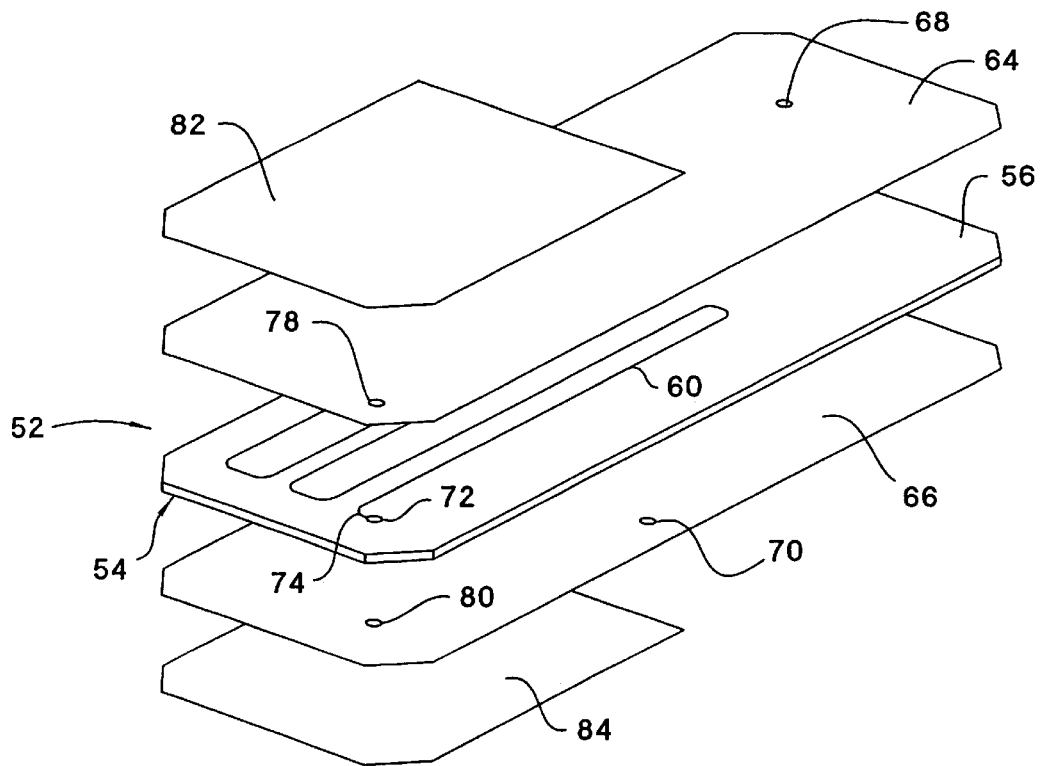
FIG. 7A (prior art) is an exploded view of a first side of a miniaturized column device having microchannels formed on two opposing planar surfaces of a support substrate.
Figure 7B:
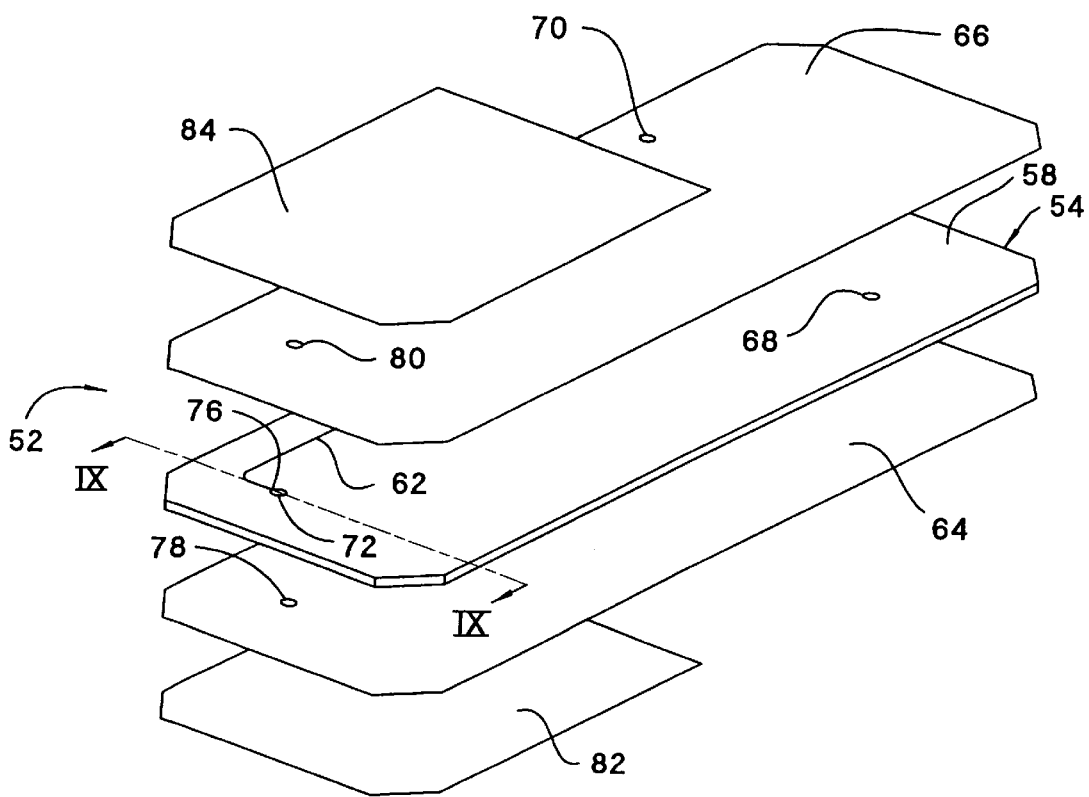
FIG. 7B (prior art) is an exploded view of a second side of the column device of FIG. 7A.

The miniaturized column device of FIGS. 7A and 7B further includes first and second cover plates, indicated at 64 and 66 respectively, which, in combination with the first and second microchannels 60 and 62, define first and second elongate separation compartments when substrate 54 is sandwiched between the first and second cover plates.

Referring still to FIGS. 7A and 7B, a plurality of apertures can be laser-ablated in the device to provide an extended separation compartment, and further to establish fluid communication means. More particularly, a conduit means 72, comprising a laser ablated aperture in substrate 54 having an axis which is orthogonal to the first and second planar surfaces 56 and 58, communicates a distal end 74 of the first microchannel 60 with a first end 76 of the second microchannel 62 to form an extended separation compartment.

Further, an aperture 68, laser ablated in the first cover plate 64, enables fluid communication with the first microchannel 60, and a second aperture 70, laser ablated in the second cover plate 66, enables fluid communication with the second microchannel 62. As will be readily appreciated, when the aperture 68 is used as an inlet port, and the second aperture 70 is used as an outlet port, a miniaturized column device is provided having a flow path extending along the combined length of the first and second microchannels 60 and 62.

In the embodiment of the invention as shown in FIGS. 7A and 7B, a wide variety of sample introduction means can be employed, such as those described above. External hardware can also be interfaced to the subject device to provide liquid handling capabilities, and a variety of means for applying a motive force along the length of the separation compartment can be associated with the device, such as by interfacing motive means with the first and/or second apertures 68 and 70 as described above.

Additionally, a variety of detection means are easily included in the subject embodiment. In this regard, a first aperture 78 can be laser ablated in the first cover plate 64, and a second aperture 80 can likewise be formed in the second cover plate 66 such that the first and second apertures will be in co-axial alignment with conduit means 72 when the substrate 54 is sandwiched between the first and second cover plates. Detection of analytes in a separated sample passing through the conduit means is thereby easily enabled, such as by connecting electrodes to the miniaturized column via apertures 78 and 80 and detecting using electrochemical techniques.

Figure 9:
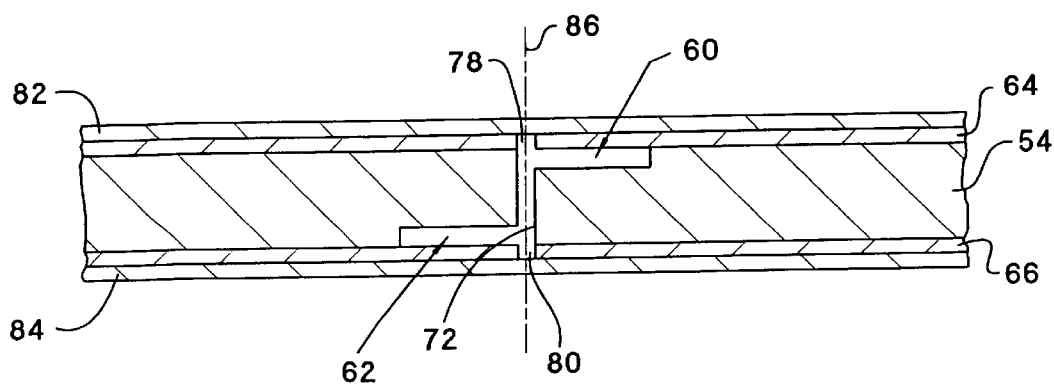
FIG. 9 (prior art) is a cross-sectional trans-axial view of the extended optical detection path length in the miniaturized column of FIG. 8 taken along lines IX—IX.

However, a key feature of the laser-ablated conduit means 72 is the ability to provide an extended optical detection path length of up to 1 mm, or greater, without experiencing untoward sample plug distortion due to increased separation compartment volumes at the point of detection. Referring to FIGS. 7A, 7B and 9, first and second transparent sheets, indicated at 82 and 84 respectively, can be provided such that the first cover plate 64 is interposed between the first transparent sheet and the first planar surface 56, and the second cover plate 66 is interposed between the second transparent sheet and the second planar surface 58. The transparent sheets 82 and 84 can be selected from appropriate materials such as quartz crystal, fused silica, diamond, sapphire and the like. Further, the transparent sheets can be provided having just enough surface area to cover and seal the apertures 78 and 80, or those sheets can be sized to cover up to the entire surface area of the column device. As described above, this feature allows additional structural rigidity to be provided to a column device formed in a particularly thin substrate.

As best shown in FIG. 9, the subject arrangement allows optical detection of sample analytes passing through the miniaturized column device to be carried out along an optical detection path length 86 corresponding to the major axis of the conduit means 72. As will be readily appreciated, the optical detection path length 86 is substantially determined by the thickness of the substrate 54, and, accordingly, a great deal of flexibility in tailoring a miniaturized column device having μ-meter column dimensions and optical path lengths of up to 1 mm or greater is thereby enabled under the instant invention. In this manner, a wide variety of associated optical detection devices may be interfaced with a miniaturized column constructed according to the invention, and detection of analytes in samples passing through the conduit means 72 may be carried out using UV/Vis, fluorescence, refractive index (RI), Raman and like spectrophotometric techniques.

Figure 8A:
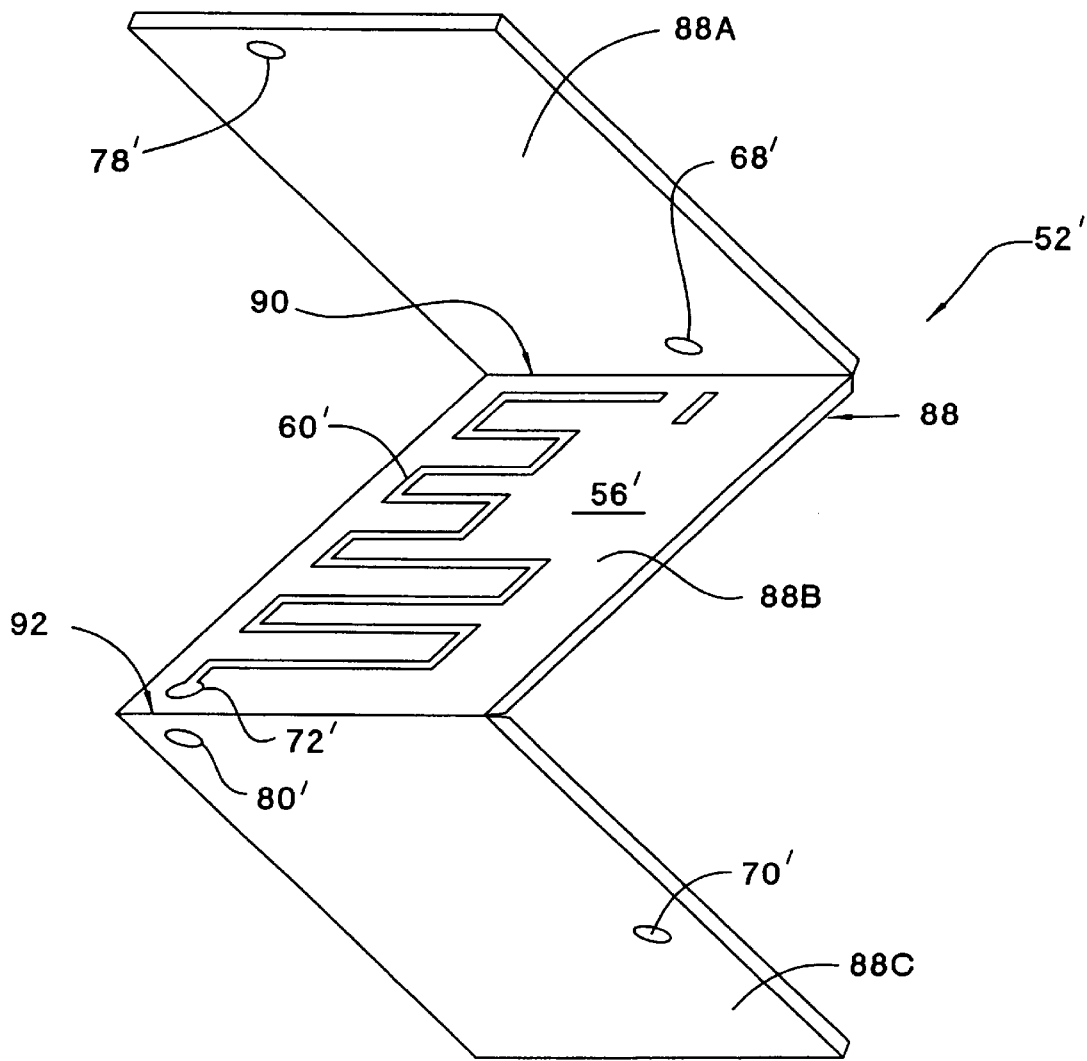
FIG. 8A (prior art) is a pictorial representation of a first side of a preferred embodiment of the miniaturized column device of FIG. 7A which is constructed from a single flexible substrate.
Figure 8B:
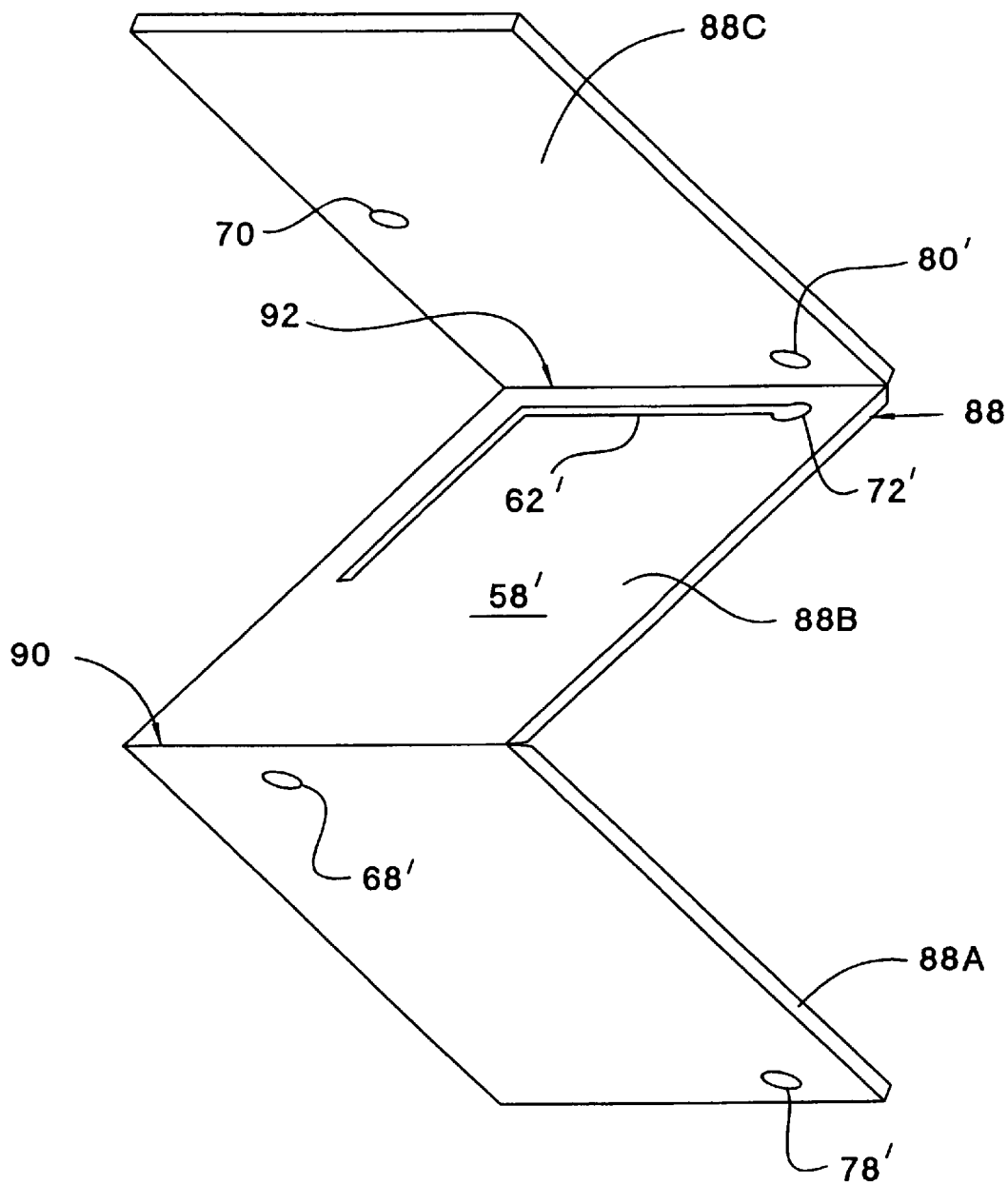
FIG. 8B (prior art) is a pictorial representation of a second side of the column device of FIG. 8A.

Referring now to FIGS. 8A and 8B, a related embodiment of the invention is shown, comprising a miniaturized column device 52', wherein the column portion and the first and second cover plates are formed in a single, flexible substrate generally indicated at 88. The flexible substrate 88 thus comprises three distinct regions, a column portion 88B, having first and second substantially planar opposing surfaces 56' and 58', respectively, where the column portion is interposed between a first cover plate portion 88A and a second cover plate portion 88C. The first and second cover plate portions have at least one substantially planar surface. The first cover plate portion 88A and the column portion 88B are separated by at least one fold means 90 such that the first cover plate portion can be readily folded to overlie the first substantially planar surface 56' of the column portion 88B. The second cover plate portion 88C and the column portion 88B are likewise separated by at least one fold means 92 such that the second cover plate can be readily folded to overlie the second substantially planar surface 58' of the column portion 88B. In particularly preferred embodiments, each fold means 90 and 92 can comprise a row of spaced-apart perforations ablated in the flexible substrate, spaced-apart slot-like depressions or apertures ablated so as to extend only part way through the substrate, or the like. The perforations or depressions can have circular, diamond, hexagonal or other shapes that promote hinge formation along a predetermined straight line.

Thus, the miniaturized column device 52' is formed by laser ablating a first microchannel 60' in the first planar surface 56' of the column portion 88B, and a second microchannel 62' in the second planar surface 58' of the column portion. Each microchannel can be provided in a wide variety of geometries. configurations and aspect ratios. A first separation compartment is then formed by folding the flexible substrate 88 at the first fold means 90 such that the first cover plate portion 88A covers the first microchannel 60' to form an elongate separation compartment. A second separation compartment is then provided by folding the flexible substrate 88 at the second fold means 92 such that the second cover plate portion 88C covers the second microchannel 62' to form a separation compartment as described above. A conduit means 72', comprising a laser ablated aperture in the column portion 88B having an axis which is orthogonal to the first and second planar surfaces 56' and 58', communicates a distal end of the first microchannel 60' with a first end of the second microchannel 62' to form a single, extended separation compartment.

Further, an aperture 68', laser ablated in the first cover plate portion 88A, enables fluid communication with the first microchannel 60', and a second aperture 70', laser ablated in the second cover plate portion 88C, enables fluid communication with the second microchannel 62'. As described above, when the first and second apertures are used as an inlet and outlet port, respectively, a miniaturized column device is provided having a flow path extending along the combined length of the first and second microchannels.

Detection means can optionally be included in the device of FIGS. 8A and 8B. In one particular embodiment, a first aperture 78' can be laser ablated in the first cover plate portion 88A, and a second aperture 80' can likewise be formed in the second cover plate portion 88C, wherein the apertures are arranged to co-axially communicate with each other and communicate with the conduit means 72' when the flexible substrate 88 is hingeably folded as described above to accurately align the apertures 78' and 80' with the conduit means 72'.

In yet further related aspects of the invention, optional micro-alignment means—formed either by laser ablation techniques or by other methods of fabricating shaped pieces well known in the art—are provided in the miniaturized column device 52'. More specifically, a plurality of corresponding laser-ablated apertures (not shown) can be provided in the column portion 88B and the first and second cover plate portions, 88A and 88C, respectively of the flexible substrate 88. The subject apertures are arranged such that co-axial alignment thereof enables the precise alignment of the column portion with one, or both of the cover plate portions to align various features such as the optional detection means with the ablated conduit. Such optional alignment can be effected using an external apparatus with means (such as pins) for cooperating with the co-axial apertures to maintain the components are portions in proper alignment with each other.

Accordingly, novel miniaturized column devices have been described which are laser ablated into a substrate other than silicon or silicon dioxide materials, and which avoid several major problems which have come to be associated with prior attempts at providing micro-column devices. The use of laser ablation techniques in the practice of the invention enables highly symmetrical and accurately defined micro-column devices to be fabricated in a wide class of polymeric and ceramic substrates to provide a variety of miniaturized liquid-phase analysis systems. In this regard, miniaturized columns may be provided which have micro-capillary dimensions (ranging from 5–200 μm in diameter) and column detection path lengths of up to 1 mm or greater. This feature has not been attainable in prior attempts at miniaturization, such as in capillary electrophoresis, without substantial engineering of a device after capillary formation. Further, laser ablation of miniaturized columns in inert substrates such as polyimides avoids the problems encountered in prior devices formed in silicon or silicon dioxide-based materials. Such problems include the inherent chemical activity and pH instability of silicon and silicon dioxide-based substrates which limits the types of separations capable of being performed in those devices.

In the practice of the invention, miniaturized column devices may be formed by laser ablating a set of desired features in a selected substrate using a step-and-repeat process to form discrete units. In this regard, it is particularly contemplated to laser ablate the subject devices in condensation polymer substrates including polyimides, polyamides, poly-esters and poly-carbonates. Further, the instant invention may be practiced using either a laser ablation process or a LIGA process to form templates encompassing a set of desired features, whereby multiple copies of miniaturized columns may be mass-produced using injection molding techniques well known in the art. More particularly, it is contemplated herein to form miniaturized columns by injection molding in substrates comprised of materials such as the following: polycarbonates; polyesters, including poly (ethylene terephthalate) and poly(butylene terephthalate); polyamides, (such as nylons); polyethers, including polyformaldehyde and poly(phenylene sulfide); polyimides, such as Kapton® and Upilex®; polyolefin compounds, including ABS polymers, Kel-F copolymers, poly(methyl methacrylate), poly(styrene-butadiene) copolymers, poly (tetrafluoroethylene), poly(ethylene-vinyl acetate) copolymers, poly(N-vinylcarbazole) and polystyrene.

Laser ablation of microchannels in the surfaces of the above-described substrates has the added feature of enabling a wide variety of surface treatments to be applied to the microchannels before formation of the sample processing compartment. That is, the open configuration of laser-ablated microchannels produced using the method of the invention enables a number of surface treatments or modifications to be performed which are not possible in closed format constructions, such as in prior micro-capillaries. More specifically, laser ablation in condensation polymer substrates provides microchannels with surfaces featuring functional groups, such as carboxyl groups, hydroxyl groups and amine groups, thereby enabling chemical bonding of selected species to the surface of the subject microchannels using techniques well known in the art. Other surface treatments enabled by the open configuration of the instant devices include surface adsorptions, polymer graftings and thin film deposition of materials such as diamond or sapphire to microchannel surfaces using masking and deposition techniques and dynamic deactivation techniques well known in the art of liquid separations.

The ability to exert rigid computerized control over the present laser ablation processes enables extremely precise microstructure formation, which, in turn, enables the formation of miniaturized columns having features ablated in two substantially planar components wherein those components may be aligned to define a composite sample processing compartment of enhanced symmetry and axial alignment. In this regard, it is contemplated to provide a further embodiment of the invention wherein laser ablation is used to create two component halves which, when folded or aligned with one another, define a single miniaturized column device.

Figure 10:
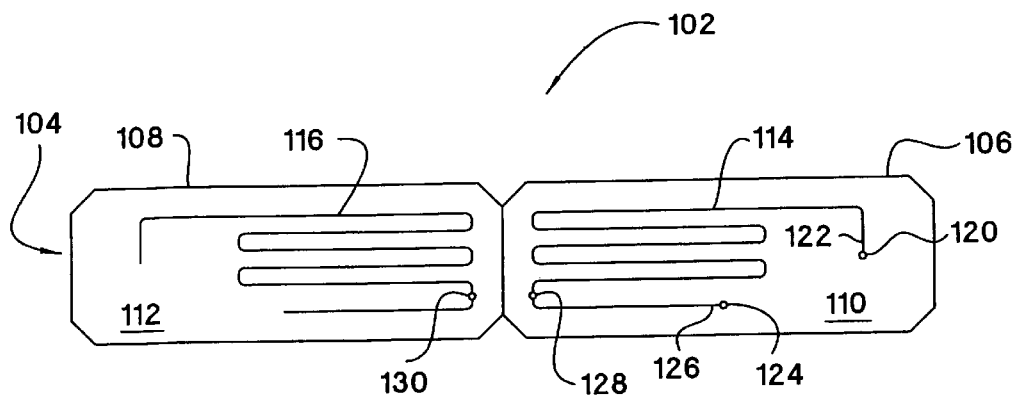
FIG. 10 (prior art) is plan view of a miniaturized column device constructed according to the invention having first and second component halves.

Referring now to FIG. 10, a miniaturized column for liquid phase analysis of a sample is generally indicated at 102. The miniaturized column 102 is formed by providing a support body 104 having first and second component halves indicated at 106 and 108 respectively. The support body may comprise a substantially planar substrate such as a polyimide film which is both laser ablatable and flexible so as to enable folding after ablation; however, the particular substrate selected is not considered to be limiting in the invention.

The first and second component halves 106 and 108 each have substantially planar interior surfaces, indicated at 110 and 112 respectively, wherein miniaturized column features may be laser ablated. More particularly, a first microchannel pattern 114 is laser ablated in the first planar interior surface 110 and a second microchannel pattern 116 is laser ablated in the second planar interior surface 112. According to the invention, said first and second microchannel patterns are ablated in the support body 104 so as to provide the mirror image of each other.

Figure 11:
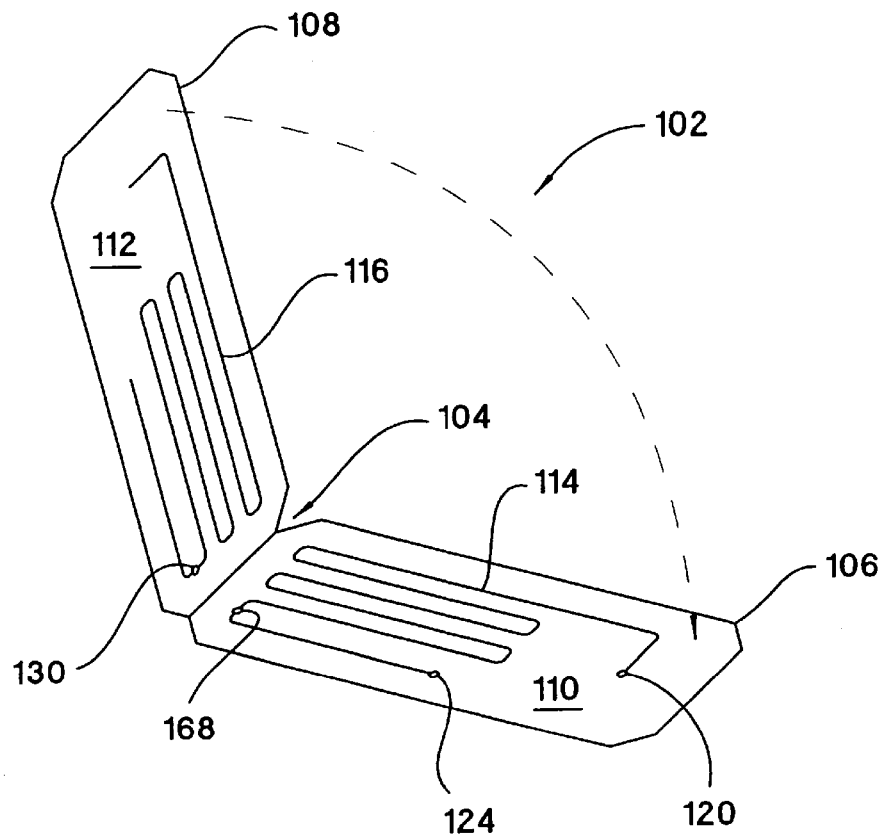
FIG. 11 (prior art) is a pictorial representation of the column device of FIG. 10 showing the folding alignment of the component halves to form a single device.
Figure 12:
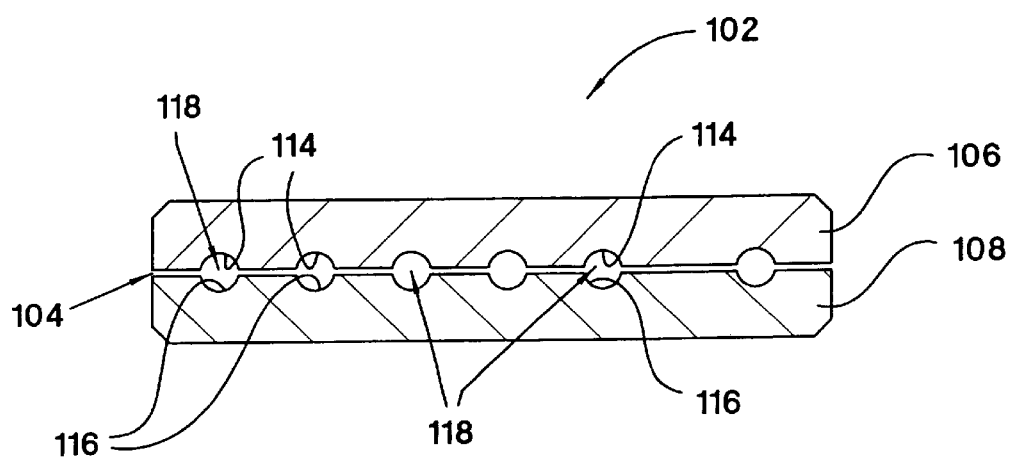
FIG. 12 (prior art) is a cross-sectional axial view of the sample processing compartment formed by the alignment of the component halves in the device of FIG. 10.

Referring now to FIGS. 11 and 12, a sample processing compartment 118, comprising an elongate bore defined by the first and second microchannel patterns 114 and 116 may be formed by aligning (such as by folding) the first and second component halves 106 and 108 in facing abutment with each other. In the practice of the invention, the first and second component halves may be held in fixable alignment with one another to form a liquid-tight sample processing compartment using pressure sealing techniques, such as by application of tensioned force, or by use of adhesives well known in the art of liquid phase separation devices. It is further contemplated according to the invention to form first and second microchannels 114 and 116 having semi-circular cross-sections whereby alignment of the component halves defines a sample processing compartment 118 having a highly symmetrical circular cross-section to enable enhanced fluid flow therethrough; however, as discussed above, a wide variety of microchannel geometries are also within the spirit of the invention.

In a further preferred embodiment of the invention, it is particularly contemplated to form the support body 104 from a polymer laminate substrate comprising a Kapton® film co-extruded with a thin layer of a thermal plastic form of polyimide referred to as KJ® and available from DuPont (Wilmington, Del.). In this manner, the first and second component halves 106 and 108 may be heat sealed together, resulting in a liquid-tight weld that has the same chemical properties and, accordingly, the same mechanical, electrical and chemical stability, as the bulk Kapton® material.

Referring now to FIGS. 10–12, the miniaturized column device 102 further comprises means for communicating associated external fluid containment means (not shown) with the sample processing compartment 118 to provide a liquid-phase separation device. More particularly, a plurality of apertures may be laser ablated in the support body 104, wherein said apertures extend from at least one exterior surface of the support body and communicate with at least one microchannel, said apertures permitting the passage of fluid therethrough. In this regard, an inlet port 120 may be laser ablated in the first component half 106 and communicate with a first end 122 of said first microchannel 114. In the same manner, an outlet port 124 may be ablated in the first component half and communicate with a second end 126 of said first microchannel 114.

As is readily apparent, a liquid phase sample processing device may thereby be formed, having a flow path extending from the first end 122 of the microchannel 114 to the second end 126 thereof, by communicating fluids from an associated source (not shown) through the inlet port 120, passing the fluids through the sample processing compartment 118 formed by the alignment of microchannels 114 and 116, and allowing the fluids to exit the sample processing compartment via the outlet port 126. In this manner, a wide variety of liquid phase analysis procedures may be carried out in the subject miniaturized column device using techniques well known in the art. Furthermore, various means for applying a motive force along the length of the sample processing compartment 118, such as a pressure differential or electric potential, may be readily interfaced to the column device via the inlet and outlet ports, or by interfacing with the sample processing compartment via additional apertures which may be ablated in the support body 104.

Inlet port 120 may be formed such that a variety of external fluid and/or sample introduction means may be readily interfaced with the miniaturized column device 102. As discussed in greater detail above, such means include external pressure injection, hydrodynamic injection or electrokinetic injection mechanisms.

Referring now to FIGS. 10 and 11, the miniaturized column device 102 further comprises detection means laser ablated in the support body 104. More particularly, a first aperture 128 is ablated in said first component half 106 and communicates with the first microchannel 114 at a point near the second end 126 thereof. A second aperture 130 is likewise formed in said second component half 108 to communicate with the second microchannel 116. Accordingly, a wide variety of associated detection means, e.g., NMR detection means, may then be interfaced to the sample processing compartment 118 to detect separated analytes of interest passing therethrough, such as by connection of electrodes to the miniaturized column via the first and second apertures 128 and 130.

In yet a further preferred embodiment of the invention, an optical detection means is provided in the miniaturized column device 102. In this regard, first and second apertures 128 and 130 may be ablated in the support body 104 such that when the component halves are aligned to form the sample processing compartment 118 said apertures are in co-axial alignment with one another, said apertures further having axes orthogonal to the plane of said support body. As will be readily appreciated by one of ordinary skill in the art, by providing transparent sheets (not shown), disposed over the exterior of the support body 104 and covering said first and second apertures 128 and 130, a sample passing through sample processing compartment 118 may be analyzed by interfacing spectrophotometric detection means with said sample through the transparent sheets using techniques well known in the art. The optical detection path length may be substantially determined by the combined thickness of said first and second component halves 106 and 108. In this manner, an optical detection path length of up to 250 $\mu$m is readily provided by ablating the miniaturized column device in a 125 $\mu$m polymer film.

Accordingly, there have been described several preferred embodiments of a miniaturized column device formed according to the invention by laser ablating microstructures on component parts and aligning the components to form columns having enhanced symmetries. As described in detail above, formation of the subject microchannels in the open configuration enables a wide variety of surface treatments and modifications to be applied to the interior surfaces of the channels before formation of the sample processing compartment. In this manner, a wide variety of liquid phase analysis techniques may be carried out in the composite sample processing compartments thus formed, including chromatographic, electrophoretic and electrochromatographic separations.

In the practice of the invention, it is further contemplated to provide optional means for the precise alignment of component support body halves, thereby ensuring accurate definition of a composite sample processing compartment formed according to the invention. More particularly, in a further preferred embodiment of the invention, microalignment means are provided to enable enhanced alignment of laser-ablated component parts such as microchannels, detection apertures and the like.

Figure 13:
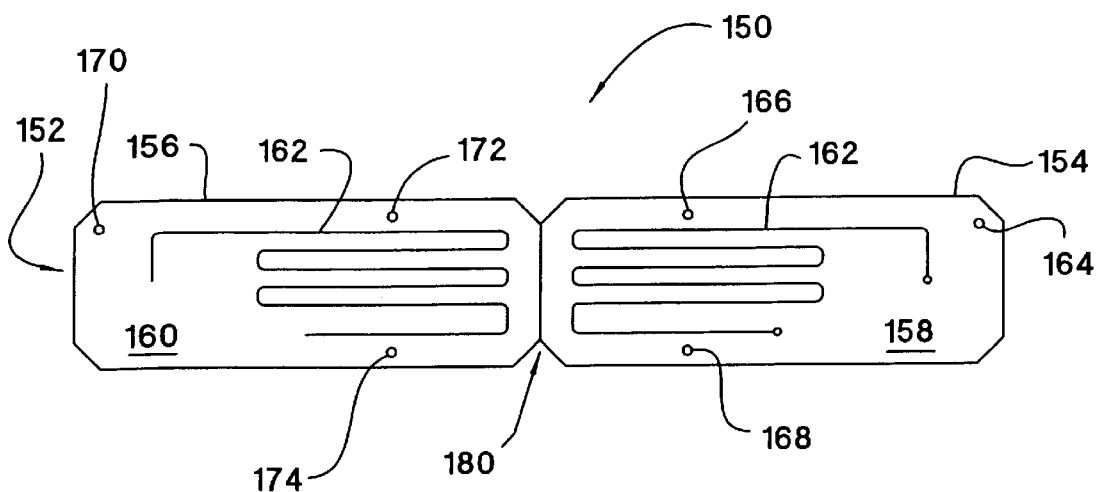
FIG. 13 (prior art) is a plan view of a further preferred embodiment of the present invention having optional micro-alignment means on first and second component halves.
Figure 14:
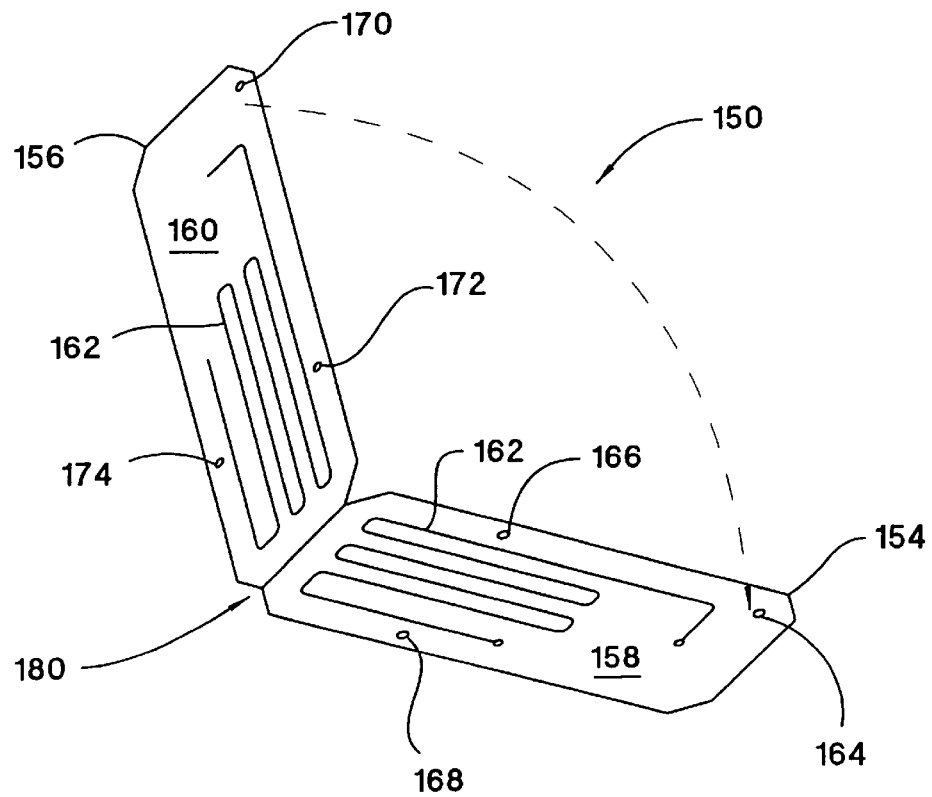
FIG. 14 (prior art) is a pictorial representation of the column device of FIG. 13 showing the micro-alignment of the component halves.

Referring now to FIGS. 13 and 14, a miniaturized column device constructed according to the present invention is generally indicated at 150 and is formed in a flexible substrate 152. The column device comprises first and second support body halves, indicated at 154 and 156 respectively, each having a substantially planar interior surface indicated at 158 and 160 respectively. The interior surfaces comprise laser-ablated microstructures, generally indicated at 162, where said microstructures are arranged to provide the mirror image of one another in the same manner as described in greater detail above.

The accurate alignment of component parts may be enabled by forming a miniaturized column device in a flexible substrate 152 having at least one fold means, generally indicated at 180, such that a first body half 154 may be folded to overlie a second body half 156. The fold means 180 may comprise a row of spaced-apart perforations ablated in the substrate 152, spaced-apart slot-like depressions or apertures ablated so as to extend only part way through the substrate, or the like. The perforations or depressions may have circular, diamond, hexagonal or other shapes that promote hinge formation along a predetermined straight line.

Accordingly, in the practice of the invention, the fold means 180 allows said first and second support body halves 154 and 156 to hingeably fold upon one another and accurately align composite features defined by said microstructures ablated on said first and second planar interior surfaces 158 and 160.

It is further contemplated to provide additional micro-alignment means formed either by laser ablation or by other methods of fabricating shaped pieces well known in the art. More specifically, a plurality of laser-ablated apertures (not shown) may be provided in said first and second support body halves 154 and 156 where said apertures are so arranged such that co-axial alignment thereof enables the precise alignment of the support body halves to define composite features such as an ablated elongate bore. Alignment may be effected using an external apparatus with means (such as pins) for cooperating with said co-axial apertures to maintain the body halves in proper alignment with one another.

Referring to FIGS. 13 and 14, in yet another particular embodiment of the invention, micro-alignment means may been formed in said first and second support body halves 154 and 156 using fabrication techniques well known in the art e.g., molding or the like. In this manner, a plurality of projections, indicated at 164, 166 and 168, may be formed in said first support body half 154. A plurality of depressions, indicated at 170, 172 and 174, may be formed in said second support body half 156.

Accordingly, as is readily apparent, the micro-alignment means are configured to form corresponding structures with one another, whereby projection 164 mates with depression 170, projection 166 mates with depression 172, and projection 168 mates with depression 174 when said support body halves are aligned in facing abutment with one another. In this manner, positive and precise alignment of support body halves 154 and 156 is enabled, thereby accurately defining composite features defined by said laser-ablated microstructures 162.

As will be readily apparent to one of ordinary skill in the art after reading this specification, a wide variety of corresponding micro-alignment features may be formed in the subject miniaturized column devices without departing from the spirit of the instant invention. Such additional features include any combination of holes and/or corresponding structures such as grooves and ridges in said component parts where said features cooperate to enable precise alignment of the component body parts.

Figure 15:
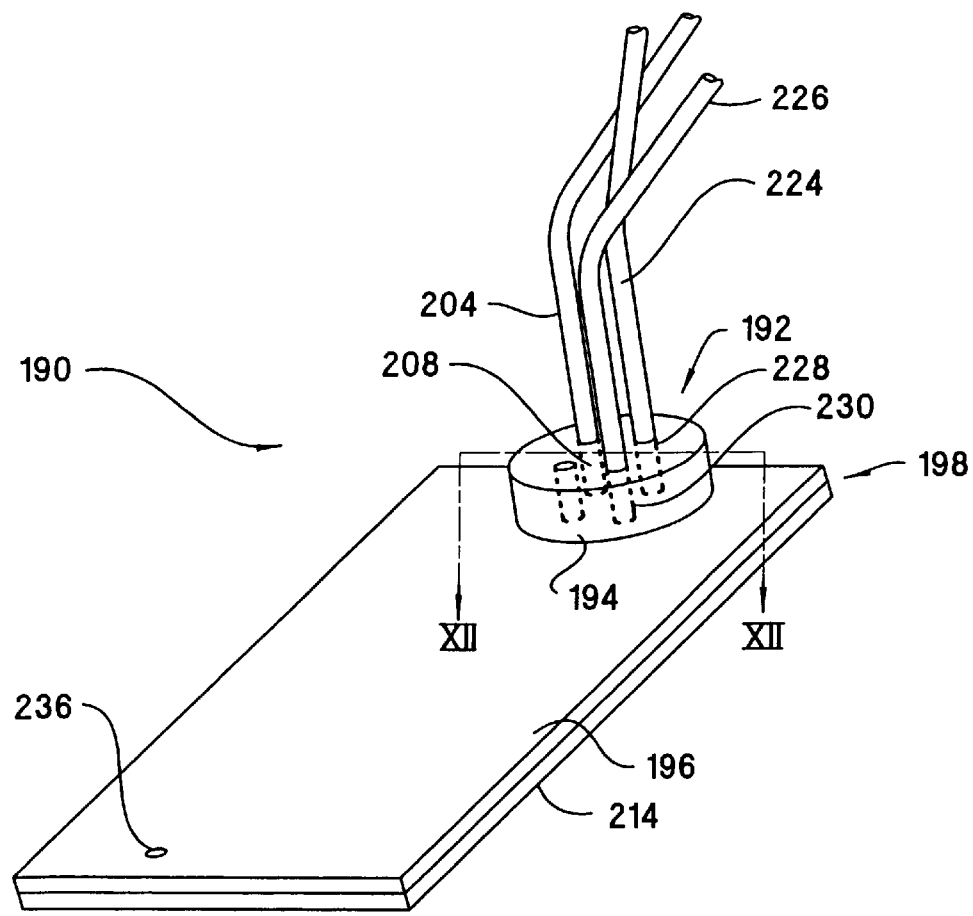
FIG. 15 is a pictorial representation of a liquid phase separation apparatus that includes an externally arranged injection means interfaced with the column device.
Figure 16:
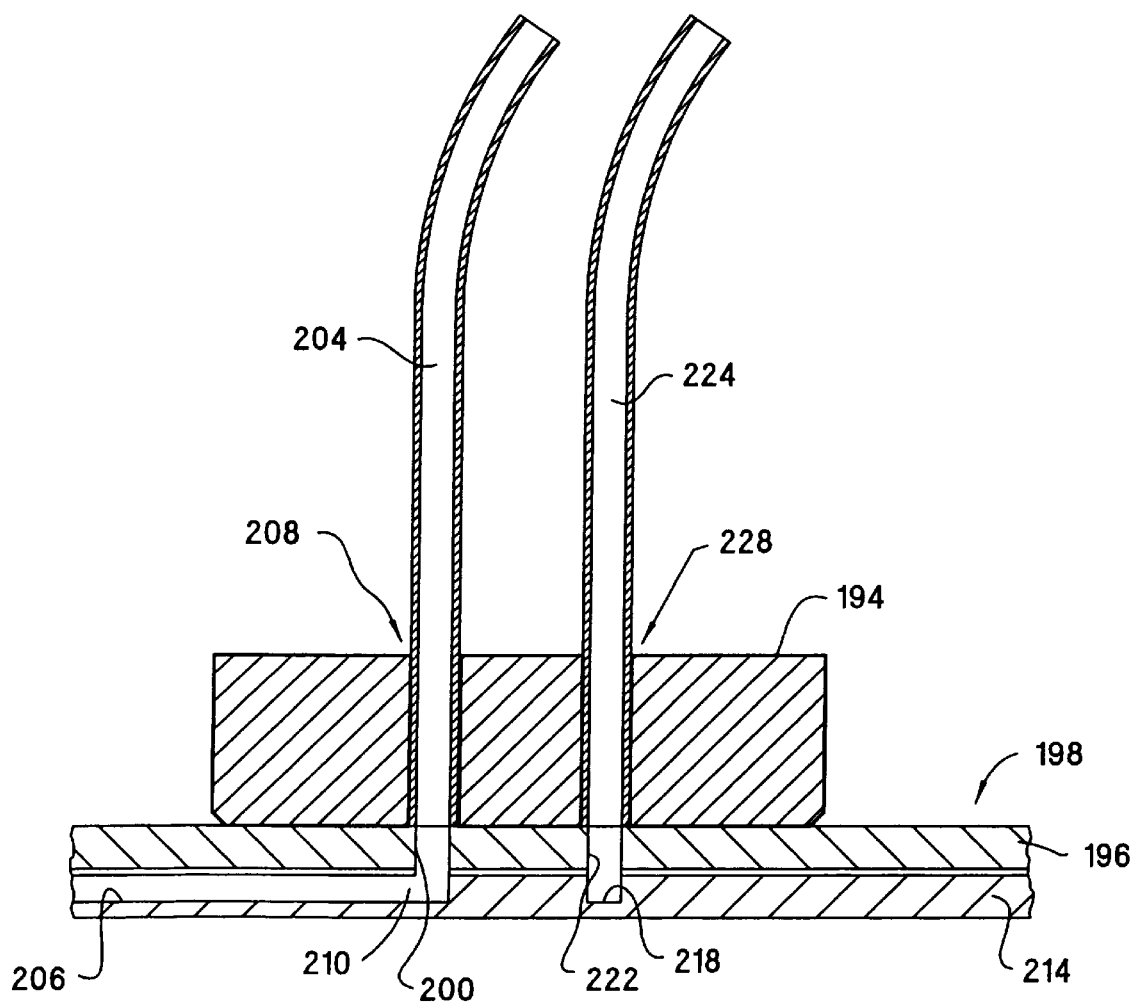
FIG. 16 is a cross-sectional view of the injection means of FIG. 15 taken along lines XII—XII.

Referring now to FIGS. 15 and 16, the apparatus 190 further includes an injection means, generally indicated at 192, which allows for the distribution of externally housed liquid samples, buffers, reagents, and makeup flow fluids into the separation compartment and/or the makeup flow compartment. Thus, in one configuration, the sample introduction means can comprise a manifold 194 that closely engages the cover plate 196 of the miniaturized column device 198, and enables the interface of associated conduits and fluid containment means with the inlet port 200 and/or the makeup fluid inlet 202.

The manifold 194 can be coupled to the cover plate 196 to form a liquid-tight interface using pressure sealing techniques known in the art. The manifold and cover plate can be mechanically urged together using clips, tension springs or any suitable clamping means known in the art. The manifold 194 generally includes a plurality of ports that are configured to correspond with the pattern of apertures and inlets present in the cover plate 196. Referring particularly to FIG. 16, a first conduit 204 can be used to interface an associated containment means (not shown) housing a sample to be separated, or a suitable buffer, with the separation channel 206. The conduit 204 is interposed within a port 208 in the manifold 194, and arranged to be in fluid communication with the upstream terminus 210 of the separation channel 206 via the inlet port 200. In this manner, fluids from the associated containment means can be readily delivered to the separation compartment using known injection methods.

The liquid phase separation apparatus 190 can include a column 198 having an optional bypass microchannel 212 laser-ablated in the substrate 214, whereby a volumetric sample compartment is formed in combination with the cover plate 196. The bypass microchannel has first and second termini, 216 and 218, which respectively cooperate with first and second laser-ablated apertures 220 and 222 that are arranged in the cover plate 196 to correspond with the subject termini when the cover plate is aligned over the substrate 214.

Second and third conduit means, 224 and 226, are respectively interposed within ports 228 and 230 in the manifold 194, whereby the conduit means communicate with the bypass microchannel 212 at the first and second termini, 216 and 218, via the first and second laser-ablated apertures 220 and 222. A sample plug having the dimensions of the volumetric sample compartment is thus provided by passing sample through the compartment from an associated containment means using the conduits 224 and 226 to provide a sample flow path to and from the containment means. By manually removing conduits 204, 224 and 226 from the manifold 194, and coupling manifold ports 228 and 208 together by way of a single conduit, a new flow path is provided that passes from the volumetric sample compartment to the upstream terminus 210 of the separation compartment. By coupling the manifold port 230 with a further conduit means that is in fluid communication with a second associated containment means housing a suitable liquid medium, the sample plug can be flushed from the volumetric sample compartment and delivered into the separation compartment by conveying medium from the second containment means to the manifold using known fluid injection methods.

Once the sample has been delivered to the separation compartment, various means for applying a motive force along the length of the separation compartment can be interfaced to the column device 304 using the manifold 306. Particularly, a pressure differential or electric potential can be established along the length of the separation compartment by coupling an external motive means to the upstream terminus of the separation channel via a manifold port.

The liquid phase separation apparatus 190 may further include detection means, disposed in the cover plate 196 and/or the substrate portion 214. The detection means can comprise one or more apertures or features that have been laser-ablated in the cover plate or substrate portion, e.g., the NMR detection chamber, and communicate with the separation compartment at a position adjacent to, or substantially nearby, the downstream terminus 232 of the separation channel 206 to enable the detection of separated analytes. Referring to FIGS. 10 and 11, one particular apparatus includes an aperture 234 that is ablated in the substrate portion 214 and communicates with the separation channel 206 near the downstream terminus 232 thereof. A second aperture 236 is ablated in the cover plate 196, and is arranged to be in coaxial alignment with the aperture 234 when the cover plate is aligned over the substrate as has been described above. The coaxial apertures allow electrodes to be connected to the miniaturized column device 198 via the subject corresponding apertures to detect separated analytes of interest passing through the separation compartment by electrochemical detection techniques. In one particular apparatus, the coaxially aligned apertures form an optical detection path, enabling the optical detection of separated analytes passing through the separation compartment. As will be appreciated by those skilled in the art, an NMR detection device and/or a wide variety of associated optical detection devices can be interfaced with the separation compartment via the coaxial apertures, enabling the practice of spectrophotometric techniques such as UV/Vis, fluorescence, refractive index (RI), Raman and the like to detect separated analytes in the liquid sample.

A liquid phase separation apparatus can also be designed to have a manifold means that is movable between a plurality of positions relative to a miniaturized planar column device. Referring now to FIGS. 13, 14 and 15A–C, an apparatus 302 is depicted which includes a miniaturized column device 304 as described herein, and a movable manifold means 306 detachably coupled to the column device 304 and arranged near the upstream terminus 308 of a separation channel 310 that has been laser-ablated in a planar surface 312 of the column substrate 314. A cover plate 316 is arranged over the planar surface 312 of the column substrate, and, in combination with the separation channel 310, forms a separation compartment. An inlet port 318, formed from an aperture laser-ablated in the cover plate 316, communicates with the upstream terminus 308 of the separation channel when the cover plate is positioned over the column substrate.

The column device 304 also includes a makeup flow channel 320 laser-ablated in the planar surface 312. A makeup flow compartment is formed by the combination of the cover plate 316 and the makeup flow microchannel 320. The makeup flow channel has an upstream terminus, 322, which is in fluid communication with a makeup inlet port 324, comprising an aperture laser-ablated in the cover plate 316 and arranged to communicate with the terminus when the cover plate is positioned over the column substrate.

The manifold 306 includes a plurality of ports that are configured to correspond with various apertures and inlets present in the cover plate 316 when the manifold is moved between positions relative to the column device 304. In one particular apparatus, the movable manifold 306 comprises a rotor that is butt-coupled to a stator (not shown) present on the external surface of the miniaturized column device 304, whereby the rotor is capable of moving about the stator between selected positions relative to the column device. When the column device is formed in a polyimide substrate, a ceramic rotor, pressed to the device using tensioned force (to form a liquid-tight seal), is capable of rotating between selected aperture positions on the device due to the friction characteristics of the two materials. Other suitable rotors can be formed in rigid materials such as glass and other non-conductive substrates.

Referring particularly to FIG. 14, the manifold 306 includes a first port 326, a second port 328, a third port 330 and a fourth port 332, each port being configured to accept an associated conduit means 334, 336, 338, and 340, respectively. The conduit means are in fluid communication with associated fluid containment means (not shown), such that a fluid sample, reagent or buffer can be communicated to the various ports in the manifold 306 for delivery into the column device 304. Referring now to FIGS. 14 and 15A, when the manifold 306 is in a first position, the first manifold port 326 is in fluid communication with the upstream terminus 308 of the separation channel 310. In this position, a suitable liquid medium, such as an equilibrating buffer or a flush solution, can be delivered into the separation compartment (at the upstream terminus 308 ) from an associated containment means via the conduit means 334. Further, when the manifold is in the first position, the third manifold port 330 is in fluid communication with the upstream terminus of the makeup flow channel 320. Thus, a suitable liquid medium can be delivered into the makeup flow compartment (at the upstream terminus 322 ) from the same, or a different associated containment means, via the conduit means 338.

Referring now to FIGS. 14 and 15B, when the manifold 306 has been rotated counter-clockwise about the stator to a second position relative the column device 304, the fourth manifold port 332 is brought into fluid communication with the upstream terminus 308 of the separation channel 310. Accordingly, a volume or aliquot of liquid sample can be delivered into the separation compartment (at the upstream terminus 308 ) from an associated sample containment means via the conduit means 340. When the manifold is arranged in the second position, the first and third manifold ports 326 and 330 are moved out of fluid communication with the separation compartment and the makeup fluid compartment such that liquid medium is no longer delivered into those compartments via conduit means 334 and 338. Further, in the second position, the second manifold port 328 is aligned to be in fluid communication with the upstream terminus 322 of the makeup fluid channel 320, and a liquid reagent, or a heated makeup fluid can be delivered into the makeup flow compartment (at the upstream terminus 322 ) from an associated sample containment means via the conduit means 336.

Accordingly, a liquid phase separation can be readily carried out using the apparatus 302, wherein the manifold 306 allows switching between a stand-by mode when the manifold is in the first position, and a separation mode when the manifold is in the second position. Alternatively, the above-described two position manifold can be used to alternate between a sample run position, corresponding to the manifold being arranged in the first position, and a sample loading position, corresponding to the manifold being arranged in the second position. The manifold 306 is switched to the second position (e.g., the position depicted in FIG. 15B) to deliver a particular volume of sample into the separation compartment. Once the sample has been delivered, the manifold is rotated clockwise about the stator to return to the first position relative the column device (e.g., the position depicted in FIG. 15C) in order to conduct liquid phase separation of the sample.

Further, as will be appreciated by those skilled in the art, movable, or multi-position manifolds, such as the manifold 306, can be coupled with any of the miniaturized column devices described herein to provide a liquid phase separation apparatus. Thus, such manifolds can be coupled to column devices which include on-device reservoirs, makeup fluid compartments, volumetric sample compartments and combinations thereof. In this manner, selective and/or temporal delivery of fluids from associated containment means into the various compartments of a miniaturized column is effected using the moveable manifolds described above.

The movable manifold can be configured in a wide variety of shapes, such as, but not limited to, an elongated finger-shaped housing or slide that is capable of either linear or rotational movement between a variety of positions, a circular or oval shaped housing capable of rotational movement between positions, or a semicircular housing that is capable of being rotated between a variety of positions. The manifold can also include any number of ports capable of communicating with an external conduit means, wherein two or more of the ports may also be capable of communicating with each other via lateral interconnecting port means. The configuration of the manifold and the layout of the ports will be generally dictated by the selected configuration of the separation compartment, the associated on-device compartments, the fluid conducting means, and the inlet ports and apertures that communicate with those elements.

A liquid phase separation apparatus may be provided having a movable manifold, wherein the manifold cooperates with an on-device volumetric sample compartment (e.g., a covered bypass channel in fluid communication with inlet and outlet means as described above), to enable the delivery of a sample plug of known volume from the sample compartment to the upstream terminus of a separation compartment. The manifold is detachably coupled to a miniaturized column device, and arranged in a first position such that external conduits disposed within two ports of the manifold enable dynamic fluid communication between the sample compartment (via the inlet and outlet means) and an associated sample containment means. A sample plug, having a volume corresponding to the dimensions of the volumetric sample compartment, is formed by the dynamic flow of sample through the compartment. By moving the manifold to a second position, different ports in the manifold are brought into fluid communication with the volumetric sample compartment inlet and outlet, whereby those ports allow the flow of an externally housed liquid medium through the sample compartment and into the separation compartment via associated conduits and/or lateral ports in the manifold. In this manner, the sample plug disposed within the volumetric sample compartment can be readily delivered to the separation compartment using known liquid injection techniques.

Figure 17:
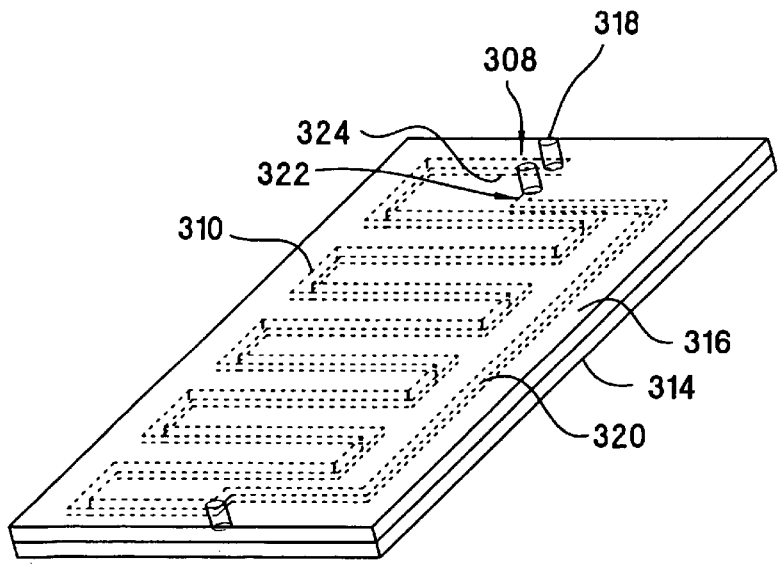
FIG. 17 is a pictorial representation of another embodiment of a miniaturized planar column device.

An apparatus may also be provided having a movable manifold that includes an internal volumetric sample compartment. Referring now to FIGS. 16 and 17, a liquid phase separation apparatus is generally indicated at 352. The apparatus includes a miniaturized column device 354, having a substrate portion 356 and a cover plate 358. A separation channel 360 is laser-ablated in a planar surface of the substrate portion 356. The separation channel has an upstream terminus 362 disposed in close proximity to three discrete laser-ablated microchannels, 364, 366, and 368, that are also formed in the substrate portion 356. The microchannel 364 has a first and second terminus, respectively indicated at 370 and 372. Likewise, the microchannel 366 has a first and second terminus, 374 and 376, and the microchannel 368 has a first and second terminus 378 and 380.

A separation compartment is formed by arranging the cover plate 358 over the planar surface of the substrate portion 356. The cover plate includes a plurality of apertures that are arranged to provide fluid communication with the separation compartment and the microchannels 364, 366 and 368 when the cover plate is in place above the substrate. Specifically, laser-ablated apertures 382 and 390, are respectively in fluid communication with the first and second terminus, 370 and 372, of the microchannel 364 to provide a first flow path. Laser-ablated apertures 384 and 392 are respectively in fluid communication with the first and second terminus, 378 and 380, of the microchannel 368 to provide a second flow path. A third flow path is provided by apertures 388 and 394, that are respectively in fluid communication with the first and second terminus, 374 and 376, of the microchannel 366. An aperture, 386, is in fluid communication with the upstream terminus 362 of the separation channel 360.

Figure 18:
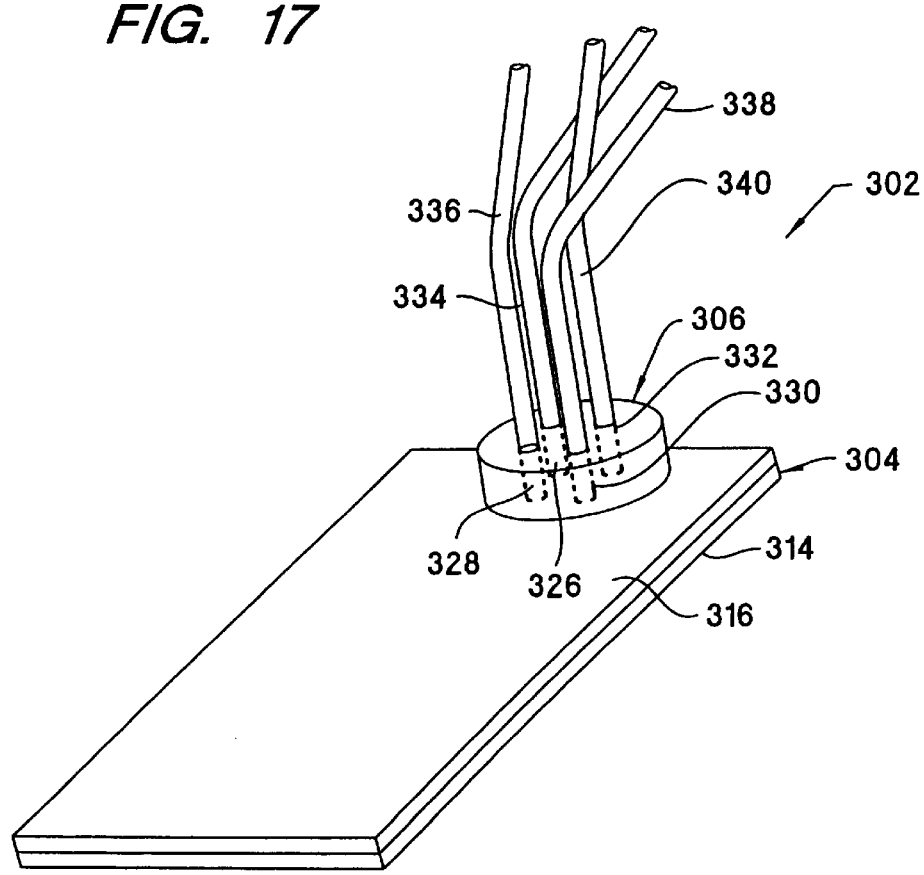
FIG. 18 is a pictorial representation of a liquid phase separation apparatus that includes the device of FIG. 17 and an externally arranged multi-position manifold means interfaced with the column device.
Figure 19A:
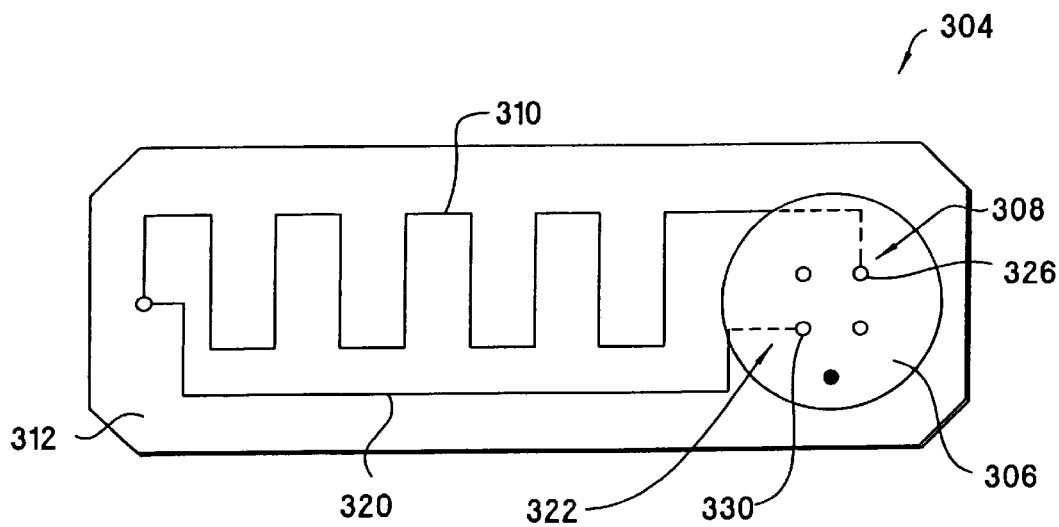
FIG. 19A is a pictorial representation of the apparatus of FIG. 18 with the manifold means arranged in a first position relative to the column device.
Figure 19B:
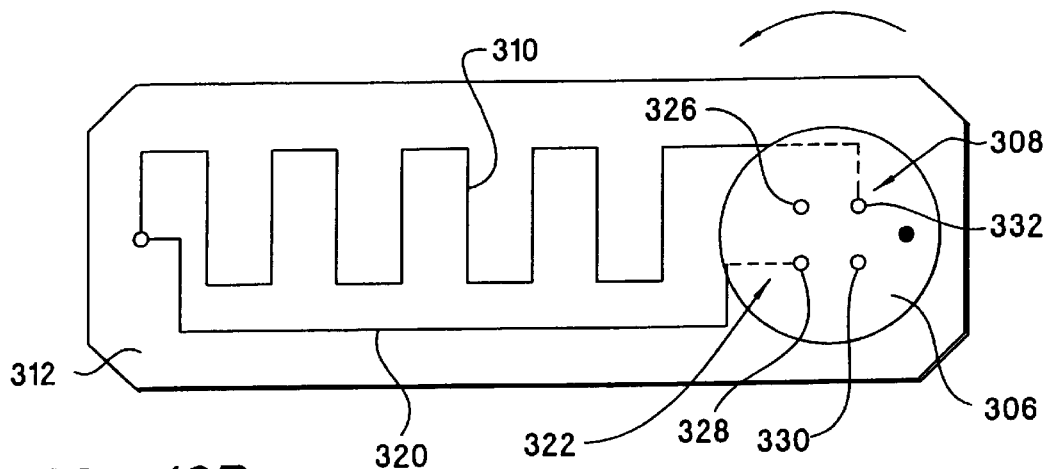
FIG. 19B is a pictorial representation of the apparatus of FIG. 18 with the manifold means arranged in a second position relative to the column device.
Figure 19C:
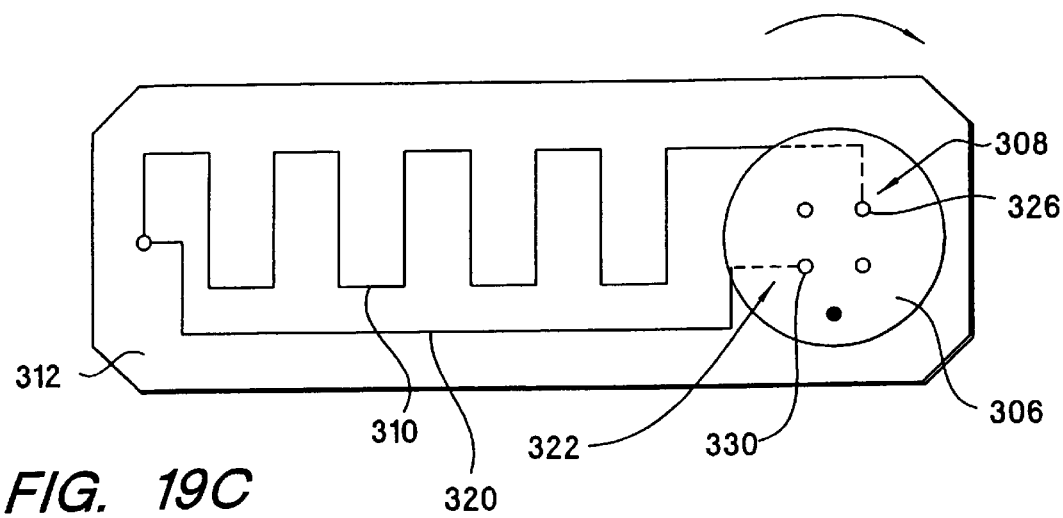
FIG. 19C is a pictorial representation of the apparatus of FIG. 18 with the manifold means returned to a first position relative to the column device.
Figure 22:
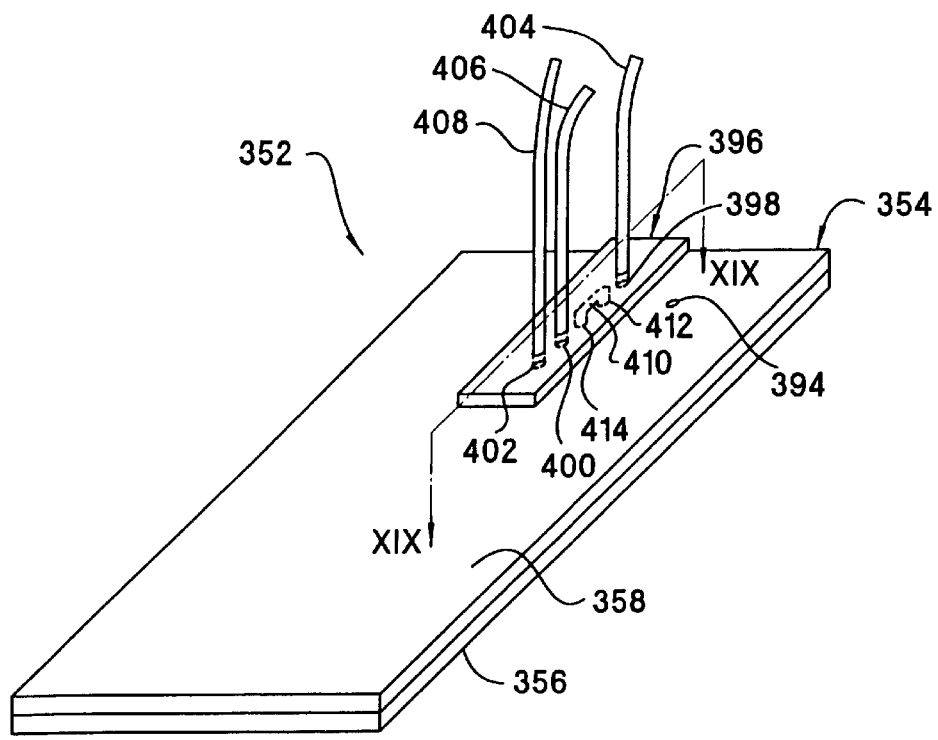
FIG. 22 is a pictorial representation of a liquid phase separation apparatus that includes the device of FIG. 21 and an externally arranged multi-position manifold means interfaced with the column device.
Figure 23:
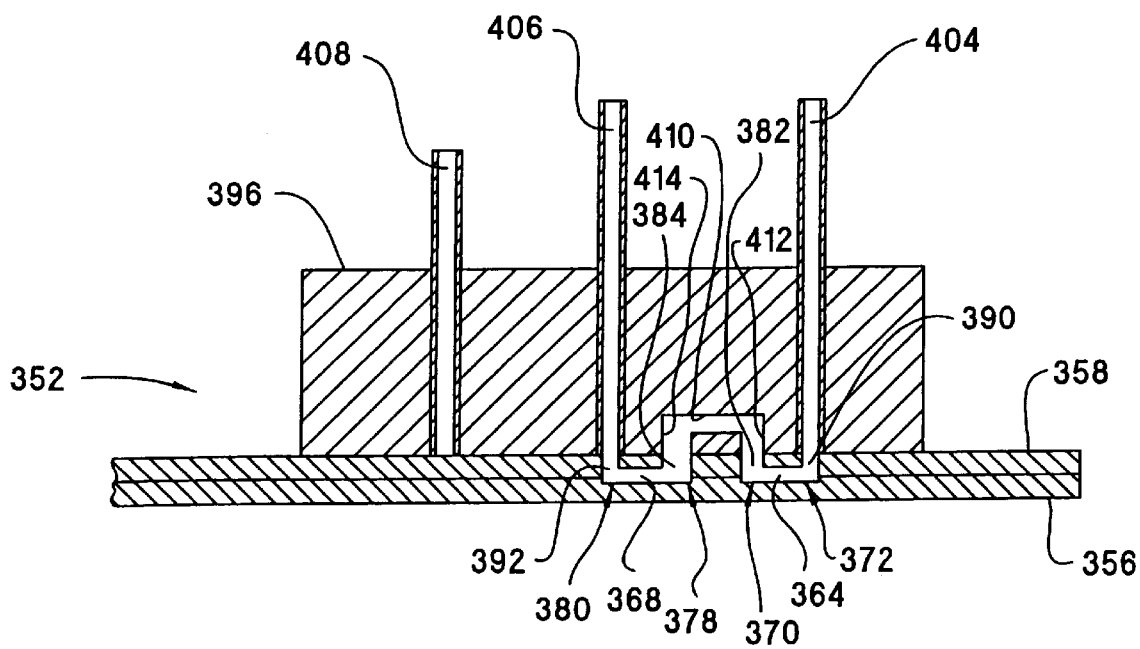
FIG. 23 is a cross-sectional view of the multi-position manifold of FIG. 22 taken along lines XIX—XIX.

Referring now to FIGS. 18 and 19, a movable manifold means 396 is coupled to the cover plate 358 to form a liquid-tight interface using known sealing techniques. Although the manifold means 396 is depicted in an elongated configuration, it is understood that the manifold can be provided in a large variety of suitable configurations as noted above. The manifold means 396 includes first, second and third ports, respectively indicated at 398, 400, and 402, wherein each port can cooperate with an external conduit means, respectively indicated at 404, 406 and 408. The manifold means 396 also includes an internal volumetric sample compartment 410, that comprises a generally U-shaped compartment having a first and second terminus, indicated at 412 and 414, respectively.

In a first position relative to the column device 354, the manifold 396 is arranged such that the manifold port 398 is in fluid communication with the aperture 390, the first terminus 412 of the internal sample compartment is in fluid communication with the aperture 382, the second terminus 414 of the internal sample compartment is in fluid communication with the aperture 384, and the manifold port 400 is in fluid communication with the aperture 392. In this first position, the manifold 396 enables one continuous flow path to be established when the conduit means 404 is communicated with an associated containment means housing a sample. Particularly, the sample is delivered to the microchannel 364 via the conduit means and passed to the volumetric sample compartment 410, continuing through the microchannel 368, and exiting the apparatus via the conduit means 406. Thus, a sample plug is formed within the volumetric sample compartment by the dynamic passage of sample therethrough.

Once a sample plug has been formed in the sample compartment 410, the manifold can be moved to a second position relative to the column device 354 by rotating the manifold counter-clockwise about a pivot (not shown) to bring the manifold port 402 into fluid communication with the aperture 394. Further, the second terminus 414 of the internal sample compartment is brought into fluid communication with the aperture 388, and the first terminus 412 of the internal sample compartment is brought into fluid communication with the aperture 386. In this position, the sample plug can be readily flushed from the volumetric sample compartment and into the separation compartment by passing a liquid medium from an external containment means through the manifold via the conduit means 408, whereby the medium passes through the aperture 394 to flow through the microchannel 366, continuing through the sample compartment 410, and passing through the aperture 386 to the upstream terminus 362 of the separation channel 360.

External hardware can be used to provide mechanical valving for divertable communication of various associated containment means containing, e.g., an electrolyte solution, flush solution or the liquid sample with the column device via the manifold means. Thus, a variety of injection methods can be used, including pressure injection, hydrodynamic injection or electrokinetic injection. The conduit means and any associated valving and injection means can communicate with the separation device through the manifold means, or communicate directly with the separation device by butt-coupling to apertures; however, any other suitable method of connection known in the art can be readily adapted to the invention. Further, it is noted that numerous other sample introduction and fluid interfacing designs can be practiced and still fall within the spirit of the subject invention.

Figure 24A:
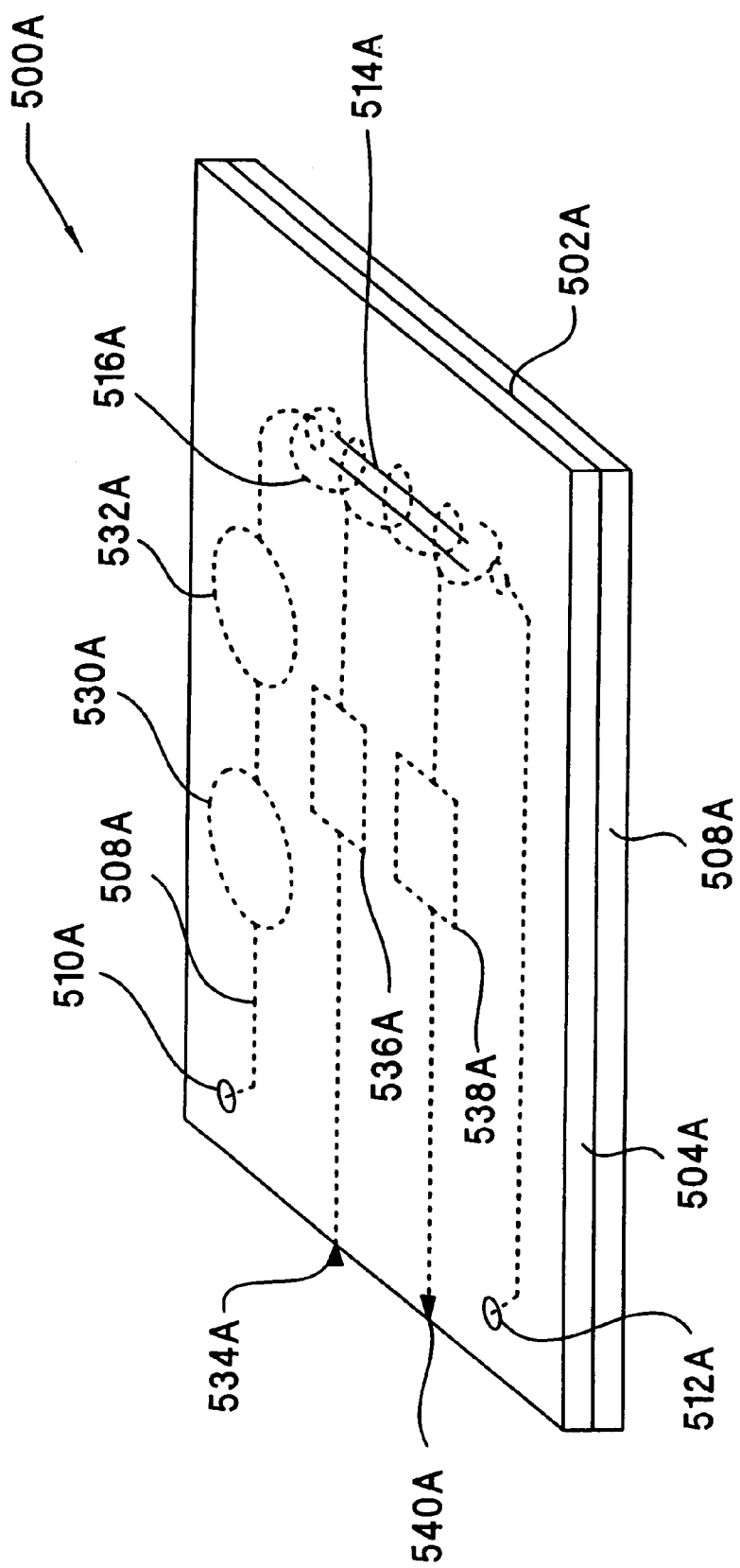
FIG. 24A illustrates a miniaturized total analysis system in which the NMR detection compartment and the NMR rf microcoil are fabricated in the support body.
Figure 24B:
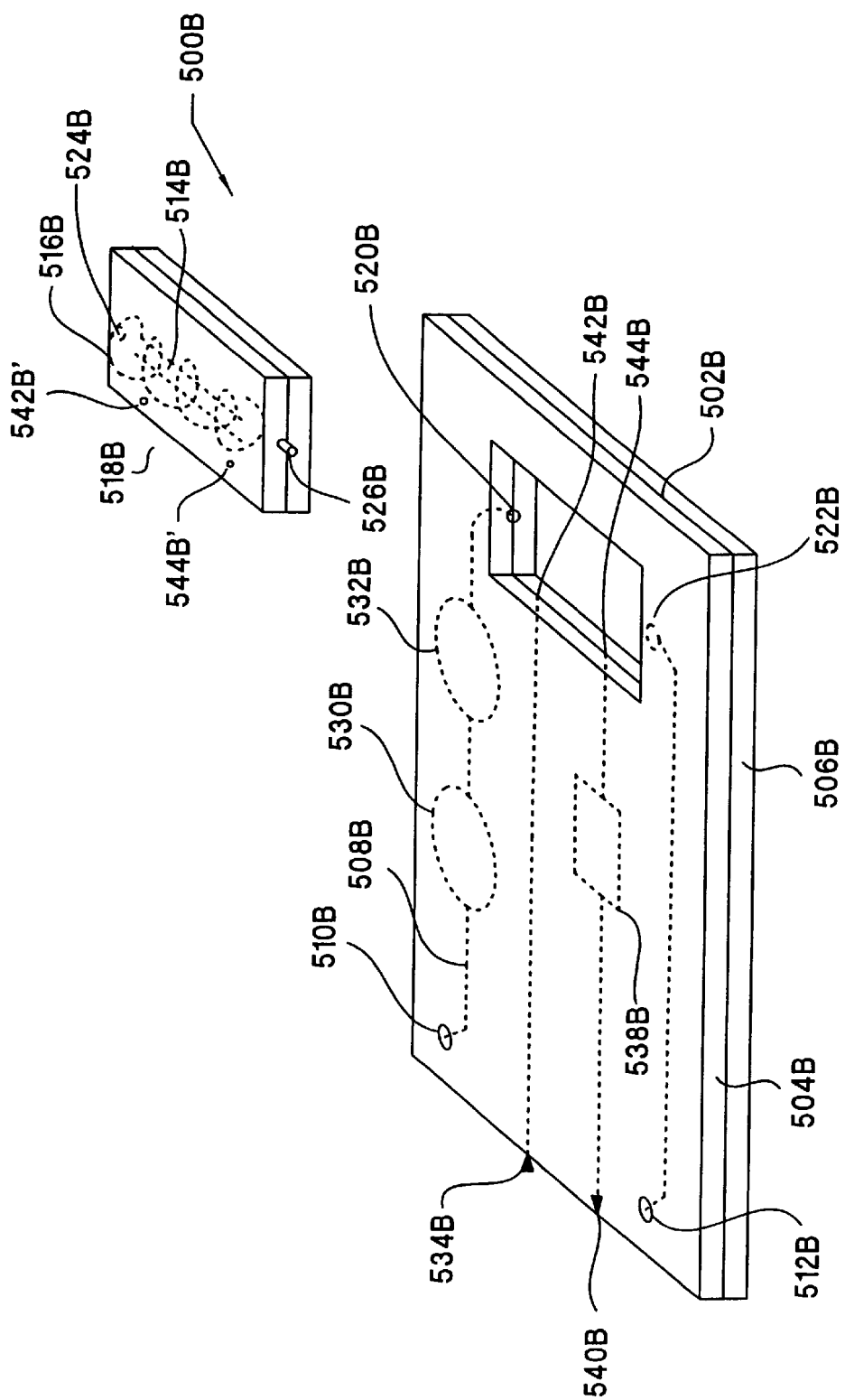

The present invention combines miniaturized device technology described above combined with NMR detection in a single fabricated device wherein, using techniques described herein, a wide variety of microstructures may be formed, as will be appreciated by those working in the field of liquid phase analysis devices. The miniaturized device includes an NMR rf microcoil in series with the separation compartment at the point of detection. The microcoil can be fabricated directly into the separation device, as illustrated in FIG. 24A and as disclosed in the Example which follows. Alternatively, as shown in FIG. 24B, a microcoil-containing module can be manufactured separate from the separation device and inserted into the device prior to use to give a liquid-tight seal with zero dead volume.

The NMR coil is formed integral with or as an attachment to the support body in any of a variety of ways that provide a coil geometry well known in the art. Any coil geometry can be used in the device that allows the radiofrequency field generated by the coil to be perpendicular to the main magnetic field.

Commonly used coil geometries include, but are not limited to, solenoid, Helmholtz, surface coil, birdcage coil, slotted-tube resonator, elliptical, back-to-back, and the like. Preferably, a coil geometry is used that provides signal-to-noise ratios of at least 3:1 and up to about 1000:1, preferably up to about 300:1, with good peak resolution, e.g. about 0.1 ppm, and minimal distortion of the main magnetic field.

In a preferred embodiment, a solenoid coil is formed directed on a nonmetalized portion of the support body. Depressions or "vias" are created in the substrate and filled with conductive material. Two halves of the substrate, the upper and lower opposing faces each having conductive metal rungs etched therein, form the connection between the top and bottom planes when folded in half. Wall thickness is determined by the thickness of the polymeric substrate, and would be minimized to ensure maximal filling factor for a sample.

Preferably, the coil is a transmit-receive coil in which the top rung and the bottom rung of the coil are formed on the exterior upper surface and the exterior lower surface of the support body, respectively, surrounding the elongate bore of the separation channel. Because of susceptibility concerns arising from the capacitors used in the tune-and-match circuit, it may be desirable to remove the tuning circuit from proximity to the coil.

One of skill in the art will recognize that any coil geometry can be used providing the sample and coil can be situated perpendicular the main magnetic field. Where signal-to-noise is a concern, a series of coils with separate transmit and receive circuitry can be repeated along the length of the detection chamber, provided that the region of interest covered by the coils does not exceed the homogeneous volume of the main magnetic field. Furthermore, multiple receive-only coils can be used with a single transmit coil for signal-to-noise optimization in situations where a single coil with multiple turns might exceed resistance constraints.

In another embodiment, the coil can be manufactured directly onto a module of polymeric substrate that can, for example, be cylindrical in shape and configured to snap into the separation channel prior to and following the sample chamber. A variety of coil configurations can be etched directly onto a metalized surface covering the polymeric tube by lithographic techniques well known in the art. The advantage of this method would be that susceptibility-reducing devices or fluids could be implemented and tested prior to inclusion in the integrated device. This also applies to testing coil performance prior to incorporation into the integrated device. Inadequate coil performance could be dealt with before the device was fully integrated.

FIGS. 24A and 24B illustrate a miniaturized device as illllustrated in FIG. 10 further comprising an integrated microcoil and a minaturized column device with a microcoil-containing module, respectively. The device, generally indicated at 500A and 500B, comprises a support body 502A and 502B having first and second component halves indicated at 504A, 504B and 506A, 506B, respectively. The first and second component halves 504A, 504B and 506A, 506B, each having substantially planar interior surfaces (not illustrated) into which microchannel has been microfabricated which, when the interior surfaces of the first and second planar halves are aligned in facing abutment with each other form elongate bore 508A, 508B. The elongate bore communicates with inlet port 510A, 510B and outlet port 512A, 512B, which enables the downstream passage of fluid from an external source through the elongate bore. In the embodiment illustrated in FIG. 24A, NMR detection compartment 514A around which is NMR rf microcoil 516A is situated downstream from inlet port 510A and in fluid communication with the elongate bore.

In the embodiment illustrated in FIG. 24B, NMR detection compartment 514B, around which is NMR rf microcoil 516B, are housed in module 518B. Elongate bore 508B terminates in upstream and downstream means 520B and 522B to form a liquid-tight, zero dead volume seal with complementary means 524B and 526B in module 518B.

Device 500A, 500B illustrated in FIG. 24A and FIG. 24B contain sample preparation chamber 530A, 530B, and sample separation chamber 532A, 532B downstream from inlet port 510A, 510B. In addition, FIG. 24A schematically illustrates a separation device with on-board transmit-receive circuitry, while FIG. 24B illustrates the device with on-board receive-only circuitry.

The circuitry illustrated in FIG. 24A comprises means 534A for introducing an NMR signal through a tone/match circuit 536A into microcoil 516A. After passing through microcoil 516A, the signal is fed into preamplifier circuit 538A and to means 538A for receiving the coil output signal.

The circuitry illustrated in FIG. 24B comprises means 534B for introducing an NMR signal into microcoil 516B. Device 500B and module 518B include means 542B, 542B' and 544B, 544B' for establishing electrical communication therebetween. After passing through microcoil 516B, the signal is fed into preamplifier circuit 538B and to means 538B for receiving the coil output signal.

For signal detection of nanoliter volumes, the coil would have a diameter preferably about 50 $\mu$m to about 100 $\mu$m and a length of 1 mm. The coil may be silver or gold or any metal optimizing the conductive characteristics of the coil. The coil may be supercooled to improve signal-to-noise. The geometry of the coil is chosen to optimize the filling factor, i.e., the number of resonant nuclei per unit volume, while maintaining the stability and functionality of the planar device. Preferably, the separation chamber is of uniform diameter throughout, with a wall thickness of between about 5 $\mu$m and about 10 $\mu$m. For CE, a bore diameter of 75 $\mu$m is preferred to avoid convective mixing from joule heating and head pressure. The volume of the sample chamber can range from less than about 10 nanoliters to 1000 nanoliters.

In addition to the NMR rf microcoil detector, other detection means may be interfaced with sample separation compartment, e.g., to serve as a sample detector and NMR trigger. For this purpose, an aperture is formed for communication with the elongate bore or sample processing compartment formed in the support body at a point upstream of the NMR microcoil detection compartment. A second aperture may be formed to communicate with the elongate bore or sample processing compartment downstream of the NMR microcoil detection compartment. The apertures serve as conduits for placing lightguide means, electrodes or other detection means in communication with the elongate bore or sample processing compartment to detect a sample passing therethrough. For example, first and second lightguide means (not shown) can be interfaced with first and second apertures to communicate with the sample processing compartment. Such lightguides can comprise optical fibers that are capable of sample illumination and light collection to enable near IR or UV-VIS optical detection of separated analytes passing through the separation compartment. The detection of separated analytes prior to their entry into the NMR detection chamber may be used for NMR signal enhancement. For example, the flow rate of analyte can be adjusted to increase its concentration within the NMR detection chamber.

The device with rf microcoil and associated fluid inputs and outputs is intended to be placed at the isocenter of the magnetic field of an NMR spectrometer. Various interfacing arrangements can be envisaged.

Figure 25:
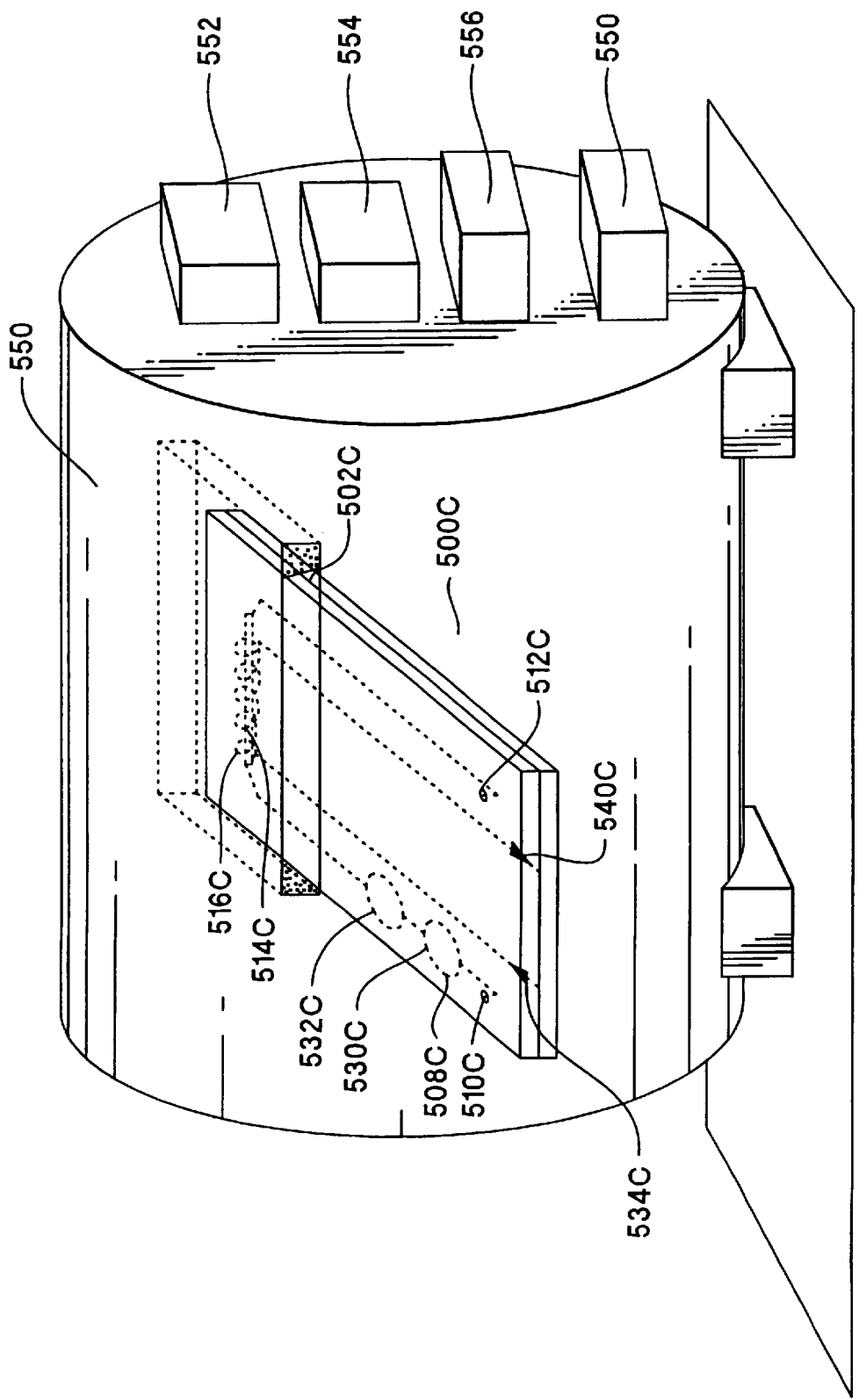
FIG. 25 schematically illustrates a separation device of this invention interfaced with a micromagnet NMR spectrometer.

In one arrangement, as shown in FIG. 25, the separation device shown generally at 500C having an integrated rf microcoil 516C is hyphenated with a miniature (tabletop) NMR magnet shown at 550. The miniature NMR magnet includes tune-and-match circuitry 552, transmit/receive electronics 554, and central computer 556 for acquisition control, data storage and signal processing. Associated electronics 558 for frequency synthesis, amplifiers, waveform generators, attenuators and pulse sequence generators for signal acquisition are controlled by the computer. Thus, in this arrangement, the tune-and-match circuitry 552 as well as the preamplifiers are separate from the miniaturized device and part of the standard configuration of the NMR magnet. Alternatively, device 500C can be fabricated as illustrated in FIG. 24A to include tune-and-match circuitry as well as preamplifiers, and the tune/match/preamplifier circuitry on the miniature NMR magnet can be bypassed.

In a second arrangement, the miniaturized separation device 500A, as illustrated in FIG. 24A, with rf microcoil 516A is hyphenated into a micromagnet NMR system. Recent technological advances in high temperature superconductors, refrigeration and pulsed field magnets suggest the feasibility of much smaller "table-top" magnets. These micro-magnets may be configured to accept the device with rf microcoil having on-board preamplifiers and/or tune and match circuitry in a manner analogous to a CD player accepting a CD disk. This micro-magnet configuration could be used as well to examine multiple devices in series, e.g., fed in on a roll following sample preparation in a "batch" mode, thereby allowing routine automated detection of multiple samples.

The advantages of having a miniaturized separation device integrated with an NMR rf microcoil include: (1) a faster time-to-result with on-line NMR analysis; (2) avoidance of sample dilution from remote sample injection; (3) sample handling capability to provide an NMR-ready sample at the point of detection; (4) increased sensitivity of NMR detection; and (5) low cost-high volume manufacture of consumable devices that are small enough to be accommodated in any high field NMR system.

It is to be understood that while the invention has been described in conjunction with the preferred specific embodiments thereof, that the description above as well as the examples which follow are intended to illustrate and not limit the scope of the invention. Other aspects, advantages and modifications within the scope of the invention will be apparent to those skilled in the art to which the invention pertains.

EXAMPLE

The following examples are put forth so as to provide those of ordinary skill in the art with a complete disclosure and description of how to use the method of the invention, and is not intended to limit the scope of what the inventors regard as their invention. Efforts have been made to ensure accuracy with respect to numbers (e.g., amounts, temperature, etc) but allowance should be made for some errors and deviations. Unless indicated otherwise, parts are parts by weight, temperature is in ° C., and pressure is at or near atmospheric.

The device described is a planar column liquid handling device capable of both solid phase sample extraction and structural determination of separated sample constituents by Nuclear Magnetic Resonance ("NMR"). Hyphenated sample processing and detection minimizes dead volume, sample volume required and solvent composition. Time to result is enhanced as a result by use of the device.

Figure 26A:
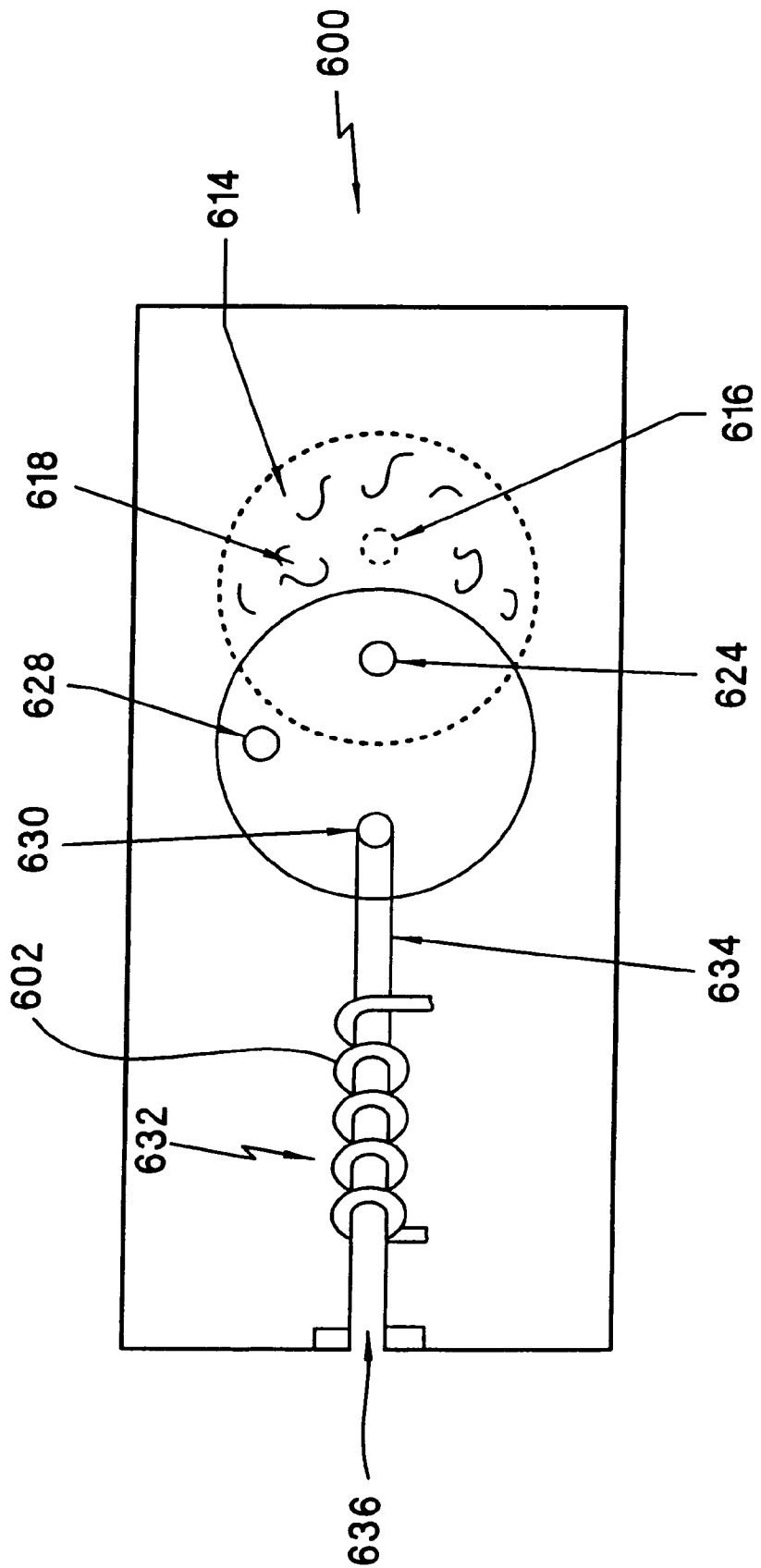
FIG. 26A and FIG. 26B are top and side views of the device described in the example.
Figure 26B:
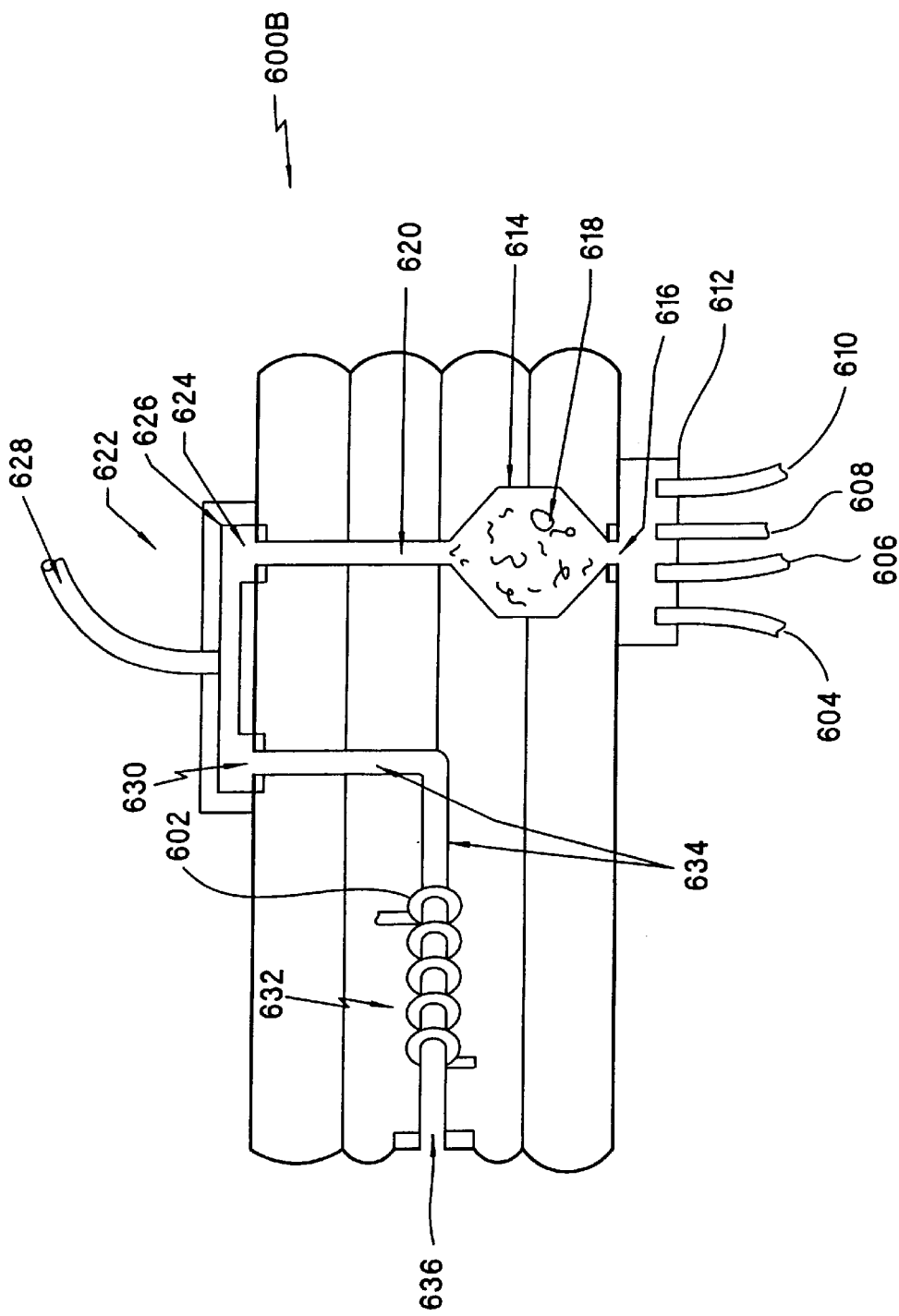

FIG. 26A and FIG. 26B illustrate top and side view of planar column device 600 with integrated NMR rf microcoil 602 includes sample and buffer inlet ports 604, 606, 608, 610, in switchable fluid communication via manifold 612 with solid phase extraction chamber 614 by inlet port 614. Extraction chamber 614 is filled with solid phase extraction material 618. The design of the device is based on the multifold geometry disclosed in commonly assigned U.S. Pat. No. 5,658,413 to Kaltenbach et al. for "Miniaturized Planar Columns in Novel Support Media for Liquid Phase Analysis."

Extraction chamber 614 is connected to an outlet channel 620 which, in turn, is connected with rotor 622, e.g., a port/valve 624 and conduit 626 assembly, for selectably directing the flow from the outlet channel to waste outlet 628 or to valve/port 630 that leads through the device thus allowing further processing or analysis of the sample. For example, valve 624 would direct voiding of unwanted fluid from solid phase extraction chamber 614 or through-flow to an NMR detection chamber 632. Fluid that is to be flushed from the system/device to waste, for example, would flow from solid-phase extraction chamber 614 through channel 620 to valve/port 624 and into conduit 626 to waste outlet 628, by which fluid can be voided to the exterior of the device. Closing of waste outlet 628, and opening of valve/port 630 allows fluid to continue through channel 634 and, thereafter, through NMR detection chamber 632. Fluid exits detection chamber 632 through port 636, from which the effluent may be collected or discarded.

The above-described device is particularly suitable for a number of various analyses, e.g., the rapid identification of drug metabolites in biological sample as described, for example, by Wilson et al. (1988) *J. Pharm. Biomed. Anal.* 6:151–165. While providing significant sample preparation in a single step, selective recovery of metabolites can also be achieved through the use of stepwise elution procedures.

Figure 26C:
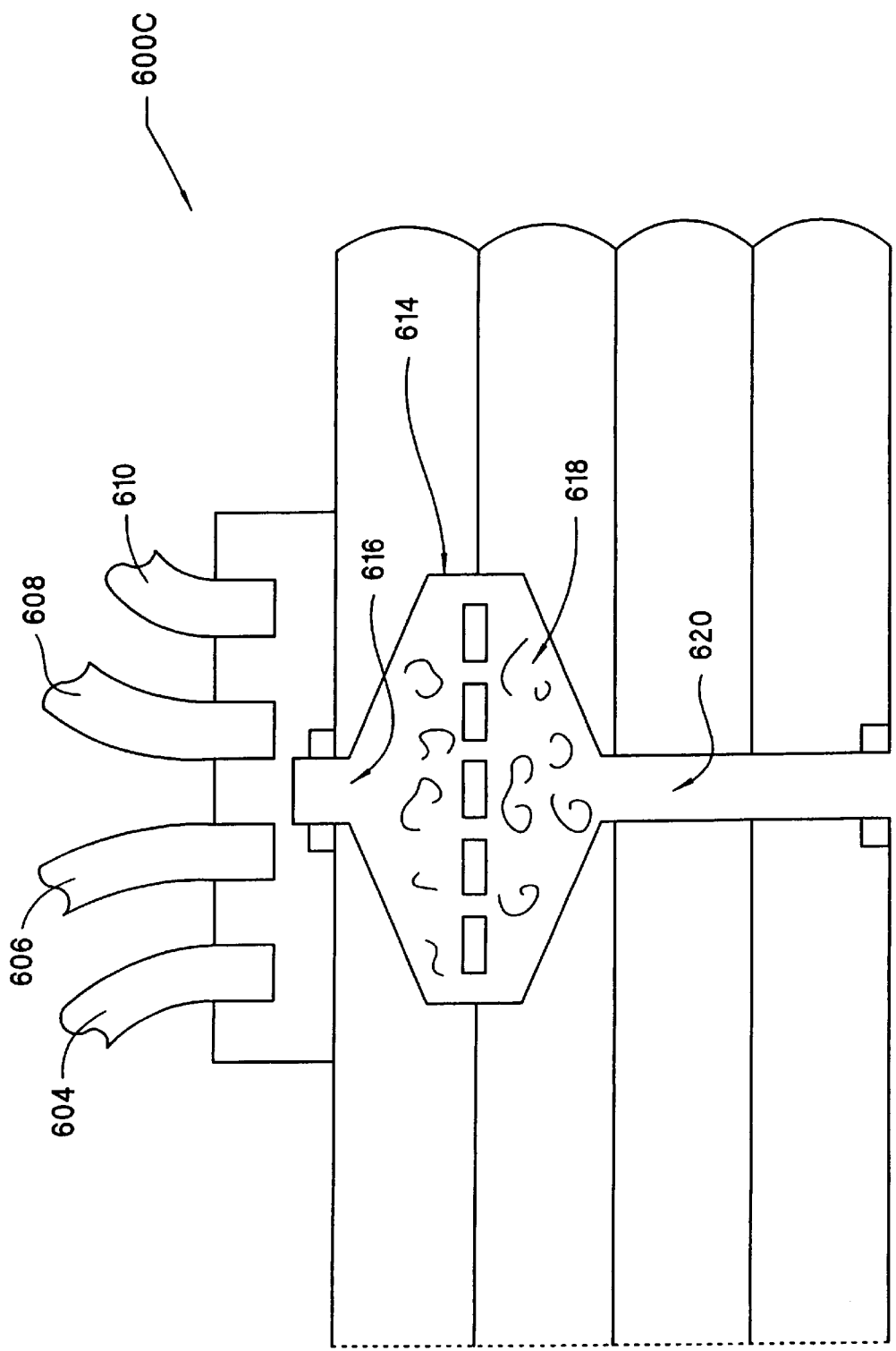
FIG. 26C and FIG. 26D are expanded views of the device showing the inlet and outlet fluid interfaces, respectively.

Device 600C is prepared as described in which chamber 614 is fabricated as illustrated in FIG. 26C. This particular chamber design is one allowing uniform flow of liquid through the chamber. This is particularly important when efficiency of separation is related to coverage of the available surface area with sample.

The chamber is ablated in the support matrix in dimensions of about 2 cm×1 cm×0.5 cm with a total bed volume of 1 ml. The chamber is filled with a high surface area micro-porous polymeric film, e.g., Empore® (3M), or inorganic film, e.g., Anopore® (Whatman). These films, either as supplied by the manufacturer or as modified by techniques well known in the art to have a selected surface modification, can be renderer to function as packed bed (1) reverse phase chromatography, (2) hydrophobic interaction chromatography, (4) ion exchange chromatography, (4) affinity chromatography, or the like. These types of packed beds are desirable for the purpose of performing solid phase extraction. The film, with surface prepared as desired, is placed in the chamber and the device is completely assembled as disclosed herein.

Figure 26D:
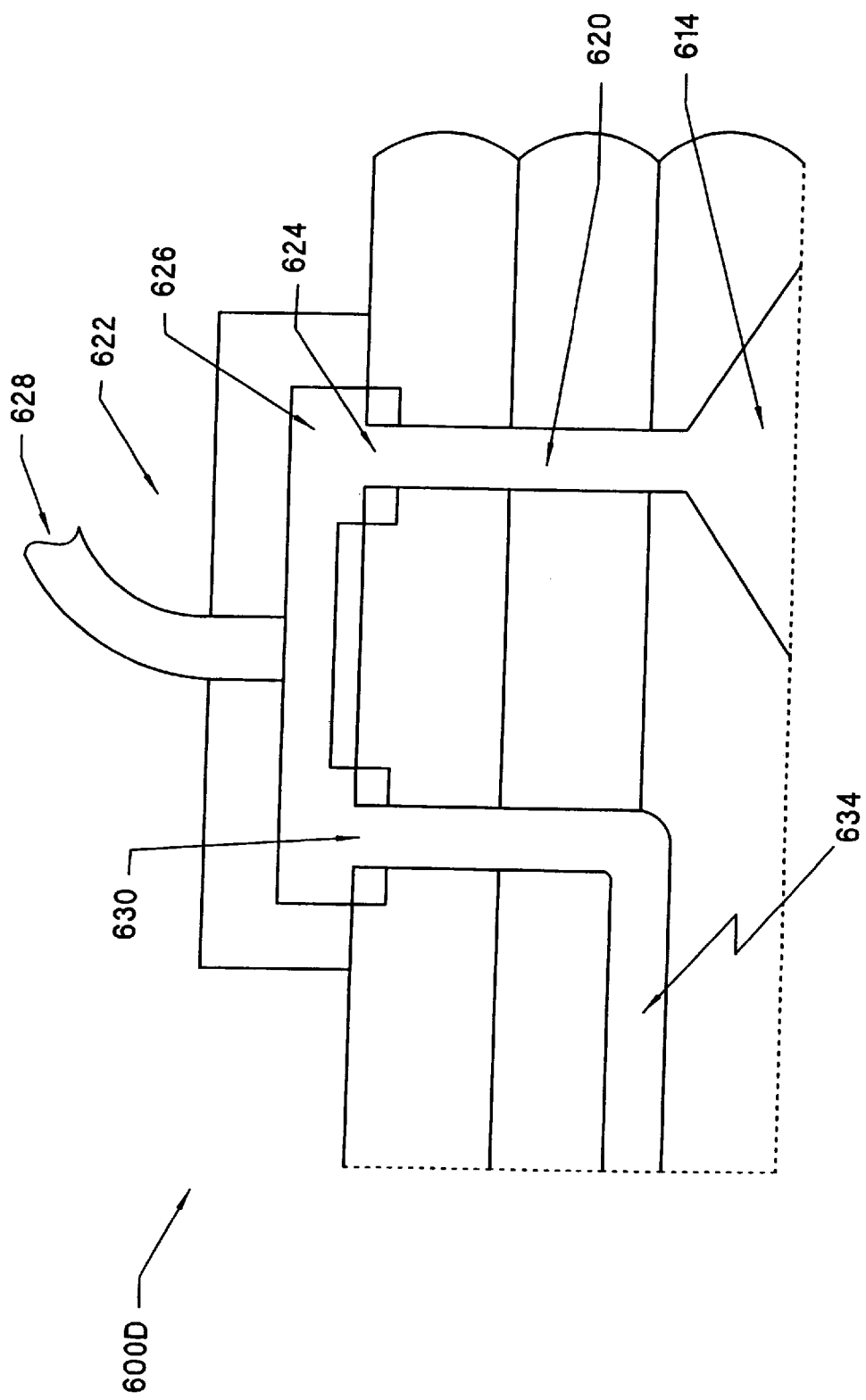

As an example of the function of such a device, as illustrated in FIG. 26D, the simultaneous measurement of drug metabolites is provided. Manifold 612 is turned so that sample line 604 is in fluid communication with inlet port 616. One milliliter of a urine sample prepared as described in Wilson et al., supra is pumped through the chamber 614 packed with film 618 having the chemical properties of a reverse phase medium. Second rotor 622 is a one-port, two-position valve allowing flow of solute directly through the device through valve/port 624 into conduit 626 and through port 630, or to be flushed out of the system as effluent through port 628. Rotor 622 is positioned so that valve/port 624 is connected to waste line 628 during the sample flushing step. Rotor 612 is then turned so that the buffer line 606 is in fluid communication with inlet port 616. The excess urine is washed from the system through waste line 628. The solutes of interest are adsorbed onto packed bed 618 of chamber 614.

The following step are the sample elution step. Solutes of increasing hydrophobic character elute according to increasing percentage of organic modifier in the release solution. Rotor 622 is positioned so that valves/ports 624 and 630 are in fluid communication with inlet port 616 and outlet port 636. In five steps ranging from 20% methanol to 100% methanol using 20% increasing increments of methanol, solutes are eluted from the packed bed medium 618 in chamber 614 to the NMR detection chamber 632. At each elution step, the NMR spectrum of the eluted sample is obtained.

After all five step elutions have been completed, packed bed medium 618 is re-equilibrated to the original aqueous buffer conditions by setting rotor 622 so that port 624 is in fluid communication with waste line 628. After sufficient bed volumes of buffer have been flushed through the system, the procedure described above for sample introduction and adsorption, elution and measurement are repeated using elution solutions containing methanol to which a chemical shift reagent has been added.

The NMR parameters of a pair of molecules related as object to mirror image are identical; chiral discrimination depends on creation of a diastereoisomeric entitles. Since spectral differences between the antipodal pair can be realized, NMR determination of chiral excess is superior to optical methods which only yield the sum total contributions from dextro- and levo- forms. The efficiency of chiral analysis by NMR depends on the ability to yield well-resolved resonances for each member of the antipodal pair and, although NMR is comparatively less sensitive than LC, detection of 1% (w/w) is possible.

Strategies for chiral discrimination by NMR include derivatization methods, in which covalent linkages are formed between the analyte and the reagent molecule, or formation of diastereoisomeric compounds held together by weak physical forces, e.g., ionic, dipolar, hydrogen bonding, and pi-pi interactions. General classes of chiral agents include chiral solvating agents, excluding metal chelates, chiral derivatizing agents, which form separate derivatives through, e.g., formation of a covalent bond, and paramagnetic shift reagents, that result in differential binding to the solute enantiomers and perturbing chemical shift due to the preferentially bound enantiomer. Examples of compounds providing chiral discrimination include cyclodextrins, acidic reagents such as mandelic acid, chiral lanthanide shift reagents such as tris(6,6,7,7,8,8,8-heptafluoro-2,2-dimethyl-3,5-octanedionato)europium (III), known as Eu(FOD), and esters of O-arylated(R)-lactic acids. In this manner, not only are the spectra of the various drug metabolites present in the urine sample obtained, but enantiomeric excess can also be determined.

Plug flow of the released solute arrived at the NMR chamber via the one-port, two-position rotor 622. Sample detection can either be through stopped flow or flow-through mode. Stopped flow involves acquisition of the NMR signal while the sample plug resides in the homogeneous volume of the detector coil. The region of signal is roughly defined as the volume of the sample enclosed by the radio-frequency coil 602. There is little signal detection from the edges of the coil. With the stopped flow method, signal averaging continues until enough signal is obtained from the sample, minimally 3:1 signal-to-noise. With the flow-through method, signal will be obtained from sample from the time it enters the coil 602, until no more sample is released from the solid phase extraction chamber 614. Some contamination of signal may arise when acquisition occurs before sample arrives in the homogeneous volume of the coil and after it leaves the homogeneous volume of the coil. Volume localized spectroscopy has been used to determine how much of a sample is contributing to a signal within the homogeneous volume. Spectra can be summed and weighted depending on the ratio of sample to unwanted signal.

We claim:

1. A miniaturized total analysis system for liquid phase sample preparation and detection comprising:

a microfabricated support body having first and second substantially planar opposing surfaces wherein the support body has a microchannel microfabricated in the first planar surface;

a cover plate arranged over the first planar surface, wherein the cover plate in combination with the first microchannel forms a sample processing compartment;

an inlet port and an outlet port communicating with the sample processing compartment, wherein the inlet and outlet ports enable downstream passage of fluid from an external source through the sample processing compartment; and downstream from the sample processing compartment and in fluid communication therewith, an NMR detection compartment around which is an NMR rf microcoil, wherein the NMR detection compartment and the NMR rf microcoil are housed within the support body.

2. The miniaturized total analysis system of claim 1, wherein the NMR detection compartment and the NMR rf microcoil comprise microstructures fabricated in the support body.

3. The miniaturized total analysis system of claim 1, wherein the NMR detection compartment and the NMR rf microcoil comprise a modular structure removably insertable into the support body.

4. The miniaturized total analysis system of claim 1, wherein the NMR rf microcoil is selected from the group consisting of solenoid coils, Helmholtz coils, surface coils and birdcage coils.

5. The miniaturized total analysis system of claim 4, wherein the coil is a transmit-receive coil.

6. The miniaturized total analysis system of claim 4, wherein the NMR rf microcoil is a receive-only coil.

7. The miniaturized total analysis system of claim 6, wherein the NMR rf microcoil is comprised of multiple receive-only coils.

8. The miniaturized total analysis system of claim 4, wherein the coil diameter is approximately 50 $\mu$m to approximately 500 $\mu$m.

9. The miniaturized total analysis system of claim 1, wherein the NMR detection compartment has a volume of approximately 5 nl to approximately 10 $\mu$l.

10. The miniaturized total analysis system of claim 1, wherein the support body is selected from the group consisting of polymeric materials, ceramic materials, glass materials, metal materials, composites thereof, and laminates thereof.

11. The miniaturized total analysis system of claim 10, wherein the support body is a polymeric material selected from the group consisting of polyimide, polycarbonate, polyester, polyamide, polyether, polyolefin, mixtures thereof and laminates thereof.

12. The miniaturized total analysis system of claim 10, wherein the support body is a composite.

13. The miniaturized total analysis system of claim 1, wherein the support body and the cover plate further comprise a microalignment means.

14. The miniaturized total analysis system of claim 13, wherein the microalignment means is selected from the group consisting of: (a) a fold means; (b) holes microfabricated in the cover plate and the support body wherein in the holes are arranged such that the coaxial alignment of corresponding holes in the cover plate and the support body enables the precise alignment of the cover plate and the support body; (c) a plurality of depressions arranged on the support body or on the cover plate and a corresponding plurality of projections arranged on the cover plate or the support body, respectively, wherein the depressions are configured to mate with the projections to enable the precise alignment of the cover plate and the support body; and (d) a plurality of apertures arranged on the support body or on the cover plate and a corresponding plurality of pins arranged on the cover plate or the support body, respectively, wherein the apertures are configured to mate with the pins to enable the precise alignment of the cover plate and the support body.

15. The miniaturized total analysis system of claim 1, further comprising first and second apertures through the support body and the cover plate, respectively, the apertures in communication with the elongate bore and having axes orthogonal to the plane of the support body, wherein the apertures are arranged to form a coaxial detection path when the interior surfaces of the support body halves are aligned in facing abutment with each other.

16. The miniaturized total analysis system of claim 15, further comprising first and second lightguide means respectively interfaced with the first and second apertures and in communication with the elongate bore.

17. A miniaturized total analysis system for liquid phase sample preparation and detection, comprising:

a microfabricated support body having first and second component halves each having substantially planar opposing interior and exterior surfaces;

a first microchannel microfabricated in the interior surface of the first support body half and a second microchannel microfabricated in the interior surface of the second support body half, wherein each of the microchannels is so arranged as to provide the mirror image of the other;

an elongate bore formed by aligning the interior surfaces of the support body halves in facing abutment with each other whereby the microchannels define the elongate bore;

an inlet port and an outlet port communicating with the elongate bore, the ports enabling the downstream passage of fluid from an external source through the elongate bore; and downstream from the elongate bore and in fluid communication therewith, an NMR detection compartment around which is an NMR rf microcoil, wherein the NMR detection compartment and the NMR rf microcoil are housed within the support body.

18. The miniaturized total analysis system of claim 17, wherein the NMR detection compartment and the NMR rf microcoil comprise microstructures fabricated in the support body.

19. The miniaturized total analysis system of claim 17, wherein the NMR detection compartment and the NMR rf microcoil comprise a modular structure removably insertable into the support body.

20. The miniaturized total analysis system of claim 17, wherein the NMR rf microcoil is selected from the group consisting of solenoid coils, Helmholtz coils, surface coils and birdcage coils.

21. The miniaturized total analysis system of claim 20, wherein the coil is a transmit-receive coil.

22. The miniaturized total analysis system of claim 20, wherein the NMR rf microcoil is a receive-only coil.

23. The miniaturized total analysis system of claim 22, wherein the NMR rf microcoil is comprised of multiple receive-only coils.

24. The miniaturized total analysis system of claim 20, wherein the coil diameter is approximately 50 $\mu$m to approximately 500 $\mu$m.

25. The miniaturized total analysis system of claim 17, wherein the NMR detection compartment has a volume of approximately 5 nl to approximately 10 $\mu$l.

26. The miniaturized total analysis system of claim 17, wherein the support body is selected from the group consisting of polymeric materials, ceramic materials, glass materials, metal materials, composites thereof and laminates thereof.

27. The miniaturized total analysis system of claim 26, wherein the support body is a polymeric material selected from the group consisting of polyimide, polycarbonate, polyester, polyamide, polyether, polyolefin, mixtures thereof and laminates thereof.

28. The miniaturized total analysis system of claim 26, wherein the support body is a composite.

29. The miniaturized total analysis system of claim 17, wherein the support body and the cover plate further comprise a microalignment means.

30. The miniaturized total analysis system of claim 29, wherein the microalignment means is selected from the group consisting of: (a) a fold means; (b) holes microfabricated in the cover plate and the support body wherein in the holes are arranged such that the coaxial alignment of corresponding holes in the cover plate and the support body enables the precise alignment of the cover plate and the support body; (c) a plurality of depressions arranged on the support body or on the cover plate and a corresponding plurality of projections arranged on the cover plate or the support body, respectively, wherein the depressions are configured to mate with the projections to enable the precise alignment of the cover plate and the support body; and (d) a plurality of apertures arranged on the support body or on the cover plate and a corresponding plurality of pins arranged on the cover plate or the support body, respectively, wherein the apertures are configured to mate with the pins to enable the precise alignment of the cover plate and the support body.

31. The miniaturized total analysis system of claim 17, further comprising first and second apertures through the first and second component halves, respectively, the apertures in communication with the elongate bore and having axes orthogonal to the plane of the support body, wherein the apertures are arranged to form a coaxial detection path when the interior surfaces of the support body halves are aligned in facing abutment with each other.

32. The miniaturized total analysis system of claim 31, further comprising first and second lightguide means respectively interfaced with the first and second apertures and in communication with the elongate bore.

33. A miniaturized total analysis system for liquid phase sample preparation and detection, comprising:
   a microfabricated support body having first and second component halves each having substantially planar opposing interior and exterior surfaces;
   a first microchannel microfabricated in the interior surface of the first support body half and a second microchannel microfabricated in the interior surface of the second support body half, wherein each of the microchannels is so arranged as to provide the mirror image of the other;
   a sample processing compartment comprising an elongate bore formed by aligning the interior surfaces of the support body halves in facing abutment with each other whereby the microchannels define the elongate bore;
   an inlet port and an outlet port communicating with the sample processing compartment, the ports enabling the downstream passage of fluid from an external source through the sample processing compartment; and
   downstream from the sample processing compartment and in fluid communication therewith, an NMR detection compartment around which is an NMR rf microcoil, wherein the NMR detectioncompartment and the NMR rf microcoil are housed within the support body.

34. The miniaturized total analysis system of claim 33, wherein the NMR detection compartment and the NMR rf microcoil comprise microstructures fabricated in the support body.

35. The miniaturized total analysis system of claim 33, wherein the NMR detection compartment and the NMR rf microcoil comprise a modular structure removably insertable into the support body.

36. The miniaturized total analysis system of claim 33, wherein the NMR rf microcoil is selected from the group consisting of solenoid coils, Helmholtz coils, surface coils and birdcage coils.

37. The miniaturized total analysis system of claim 36, wherein the coil is a transmit-receive coil.

38. The miniaturized total analysis system of claim 36, wherein the NMR rf microcoil is a receive-only coil.

39. The miniaturized total analysis system of claim 38, wherein the NMR rf microcoil is comprised of multiple receive-only coils.

40. The miniaturized total analysis system of claim 36, wherein the coil diameter is approximately 50 $\mu$m to approximately 500 $\mu$m.

41. The miniaturized total analysis system of claim 33, wherein the NMR detection compartment has a volume of approximately 5 nl to approximately 10 $\mu$l.

42. The miniaturized total analysis system of claim 33, wherein the support body is selected from the group consisting of polymeric materials, ceramic materials, glass materials, metal materials, composites thereof and laminates thereof.

43. The miniaturized total analysis system of claim 42, wherein the support body is a polymeric material selected from the group consisting of polyimide, polycarbonate, polyester, polyamide, polyether, polyolefin, mixtures thereof and laminates thereof.

44. The miniaturized total analysis system of claim 42, wherein the support body is a composite.

45. The miniaturized total analysis system of claim 33, wherein the support body and the cover plate further comprise a microalignment means.

46. The miniaturized total analysis system of claim 45, wherein the microalignment means is selected from the group consisting of: (a) a fold means; (b) holes microfabricated in the cover plate and the support body wherein in the holes are arranged such that the coaxial alignment of corresponding holes in the cover plate and the support body enables the precise alignment of the cover plate and the support body; (c) a plurality of depressions arranged on the support body or on the cover plate and a corresponding plurality of projections arranged on the cover plate or the support body, respectively, wherein the depressions are configured to mate with the projections to enable the precise alignment of the cover plate and the support body; and (d) a plurality of apertures arranged on the support body or on the cover plate and a corresponding plurality of pins arranged on the cover plate or the support body, respectively, wherein the apertures are configured to mate with the pins to enable the precise alignment of the cover plate and the support body.

47. The miniaturized total analysis system of claim 33, further comprising first and second apertures through the first and second component halves, respectively, the apertures in communication with the separation compartment and having axes orthogonal to the plane of the support body, wherein the apertures are arranged to form a coaxial detection path when the interior surfaces of the support body halves are aligned in facing abutment with each other.

48. The miniaturized total analysis system of claim 47, further comprising first and second lightguide means respectively interfaced with the first and second apertures and in communication with the sample processing compartment.

49. An integrated device for sample preparation and NMR detection, comprising:
   (a) a miniaturized total analysis system for liquid phase sample preparation and detection, comprising
      a microfabricated support body having first and second component halves each having substantially planar opposing interior and exterior surfaces,
      a first microchannel microfabricated in the interior surface of the first support body half and a second microchannel microfabricated in the interior surface of the second support body half, wherein each of the microchannels is so arranged as to provide the mirror image of the other, an elongate bore formed by aligning the interior surfaces of the support body halves in facing abutment with each other whereby the microchannels define the elongate bore, an inlet port and an outlet port communicating with the elongate bore, the ports enabling the downstream passage of fluid from an external source through the elongated bore downstream from the elongate bore and in fluid communication therewith, an NMR detection compartment around which is an NMR rf microcoil, wherein the NMR detection compartment and the NMR rf microcoil are housed within the support body; and (b) a magnet configured to accept the miniaturized total analysis system, wherein the device is capable of generating an NMR spectrum.

50. The integrated device of claim 49, wherein the NMR detection compartment and the NMR rf microcoil comprise microstructures fabricated in the support body.

51. The integrated device of claim 49, wherein the NMR detection compartment and the NMR rf microcoil comprise a modular structure removably insertable into the support body.

52. The integrated device of claim 49, wherein the NMR rf microcoil is selected from the group consisting of solenoid coils, Helmholtz coils, surface coils and birdcage coils.

53. The integrated device of claim 52, wherein the coil is a transmit-receive coil.

54. The integrated device of claim 52, wherein the NMR rf microcoil is a receive-only coil.

55. The integrated device of claim 54, wherein the NMR rf microcoil is comprised of multiple receive-only coils.

56. The integrated device of claim 52, wherein the coil diameter is approximately 50 $\mu$m to approximately 500 $\mu$m.

57. The integrated device of claim 49, wherein the NMR detection compartment has a volume of approximately 5 nl to approximately 10 $\mu$l.

58. The integrated device of claim 49, wherein the support body is selected from the group consisting of polymeric materials, ceramic materials, glass materials, metal materials, composites thereof and laminates thereof.

59. The integrated device of claim 58, wherein the support body is a polymeric material selected from the group consisting of polyimide, polycarbonate, polyester, polyamide, polyether, polyolefin, mixtures thereof and laminates thereof.

60. The integrated device of claim 58, wherein the support body is a composite.

61. The integrated device of claim 49, wherein the support body and the cover plate further comprise a microalignment means.

62. The integrated device of claim 61, wherein the microalignment means is selected from the group consisting of: (a) a fold means; (b) holes microfabricated in the cover plate and the support body wherein in the holes are arranged such that the coaxial alignment of corresponding holes in the cover plate and the support body enables the precise alignment of the cover plate and the support body; (c) a plurality of depressions arranged on the support body or on the cover plate and a corresponding plurality of projections arranged on the cover plate or the support body, respectively, wherein the depressions are configured to mate with the projections to enable the precise alignment of the cover plate and the support body; and (d) a plurality of apertures arranged on the support body or on the cover plate and a corresponding plurality of pins arranged on the cover plate or the support body, respectively, wherein the apertures are configured to mate with the pins to enable the precise alignment of the cover plate and the support body.

63. The integrated device of claim 49, further comprising first and second apertures through the first and second component halves, respectively, the apertures in communication with the elongate bore and having axes orthogonal to the plane of the support body, wherein the apertures are arranged to form a coaxial detection path when the interior surfaces of the support body halves are aligned in facing abutment with each other.

64. The integrated device of claim 63, further comprising first and second lightguide means respectively interfaced with the first and second apertures and in communication with the elongate bore.

65. An integrated device for sample preparation and NMR detection, comprising:

(a) a miniaturized total analysis system for liquid phase sample preparation and detection, comprising a microfabricated support body having first and second component halves each having substantially planar opposing interior and exterior surfaces, a first microchannel microfabricated in the interior surface of the first support body half and a second microchannel microfabricated in the interior surface of the second support body half, wherein each of the microchannels is so arranged as to provide the mirror image of the other, a sample processing compartment comprising an elongate bore formed by aligning the interior surfaces of the support body halves in facing abutment with each other whereby the microchannels define the elongate bore, an inlet port and an outlet port communicating with the sample processing compartment, the ports enabling the downstream passage of fluid from an external source through the sample processing compartment, and downstream from the sample processing compartment and in fluid communication therewith, an NMR detection compartment around which is an NMR rf microcoil, wherein the NMR detection compartment and the NMR rf microcoil arc housed within the support body; and (b) a magnet configured to accept the miniaturized total analysis system, wherein the device is capable of generating an NMR spectrum.

66. The integrated device of claim 65, wherein the NMR detection compartment and the NMR rf microcoil comprise microstructures fabricated in the support body.

67. The integrated device of claim 65, wherein the NMR detection compartment and the NMR rf microcoil comprise a modular structure removably insertable into the support body.

68. The integrated device of claim 65, wherein the NMR rf microcoil is selected from the group consisting of solenoid coils, Helmholtz coils, surface coils and birdcage coils.

69. The integrated device of claim 68, wherein the coil is a transmit-receive coil.

70. The integrated device of claim 68, wherein the NMR rf microcoil is a receive-only coil.

71. The integrated device of claim 70, wherein the NMR rf microcoil is comprised of multiple receive-only coils.

72. The integrated device of claim 68, wherein the coil diameter is approximately 50 $\mu$m to approximately 500 $\mu$m.

73. The integrated device of claim 68, wherein the NMR detection compartment has a volume of approximately 5 nl to approximately 10 $\mu$l.

74. The integrated device of claim 65, wherein the support body is selected from the group consisting of polymeric materials, ceramic materials, glass materials, metal materials, composites thereof and laminates thereof.

75. The integrated device of claim 74, wherein the support body is a polymeric material selected from the group consisting of polyimide, polycarbonate, polyester, polyamide, polyether, polyolefin, mixtures thereof and laminates thereof.

76. The integrated device of claim 74, wherein the support body is a composite.

77. The integrated device of claim 65, wherein the support body and the cover plate further comprise a microalignment means.

78. The integrated device of claim 77, wherein the microalignment means is selected from the group consisting of: (a) a fold means; (b) holes microfabricated in the cover plate and the support body wherein in the holes are arranged such that the coaxial alignment of corresponding holes in the cover plate and the support body enables the precise alignment of the cover plate and the support body; (c) a plurality of depressions arranged on the support body or on the cover plate and a corresponding plurality of projections arranged on the cover plate or the support body, respectively, wherein the depressions are configured to mate with the projections to enable the precise alignment of the cover plate and the support body; and (d) a plurality of apertures arranged on the support body or on the cover plate and a corresponding plurality of pins arranged on the cover plate or the support body, respectively, wherein the apertures are configured to mate with the pins to enable the precise alignment of the cover plate and the support body.

79. The integrated device of claim 65, further comprising first and second apertures through the first and second component halves, respectively, the apertures in communication with the separation compartment and having axes orthogonal to the plane of the support body, wherein the apertures are arranged to form a coaxial detection path when the interior surfaces of the support body halves are aligned in facing abutment with each other.

80. The integrated device of claim 79, further comprising first and second lightguide means respectively interfaced with the first and second apertures and in communication with the sample processing compartment.

81. The miniaturized total analysis system of claim 1, wherein the support body is comprised of a material other than silicon or silicon dioxide and the miniaturized total analysis system provides a signal-to-noise ratio of at least 3:1.

82. The miniaturized total analysis system of claim 17, wherein the support body is comprised of a material other than silicon or silicon dioxide and the miniaturized total analysis system provides a signal-to-noise ratio of at least 3:1.

83. The miniaturized total analysis system of claim 33 wherein the support body is comprised of a material other than silicon or silicon dioxide and the miniaturized total analysis system provides a signal-to-noise ratio of at least 3:1.

84. The integrated device of claim 49, wherein the support body is comprised of a material other than silicon or silicon dioxide and the integrated device provides a signal-to-noise ratio of at least 3:1.

85. The integrated device of claim 65, wherein the support body is comprised of a material other than silicon or silicon dioxide and the integrated device provides a signal-to-noise ratio of at least 3:1.

86. A miniaturized total analysis system for liquid phase sample preparation and detection comprising:
a microfabricated support body having first and second substantially planar opposing surfaces wherein the support body has a microchannel microfabricated in the first planar surface;
a cover plate arranged over the first planar surface, wherein the cover plate in combination with the first microchannel forms a sample processing compartment;
an inlet port and an outlet port communicating with the sample processing compartment, wherein the inlet and outlet ports enable downstream passage of fluid from an external source through the sample processing compartment; and
downstream from the sample processing compartment, a module comprising an NMR detection compartment and an NMR rf microcoil, the module being insertable into the support body such that the NMR detection compartment is in fluid communication with the sample processing compartment.

87. A miniaturized total analysis system for liquid phase sample preparation and detection, comprising:
a microfabricated support body having first and second component halves each having substantially planar opposing interior and exterior surfaces;
a first microchannel microfabricated in the interior surface of the first support body half and a second microchannel microfabricated in the interior surface of the second support body half, wherein each of the microchannels is so arranged as to provide the mirror image of the other;
an elongate bore formed by aligning the interior surfaces of the support body halves in facing abutment with each other whereby the microchannels define the elongate bore;
an inlet port and an outlet port communicating with the elongate bore, the ports enabling the downstream passage of fluid from an external source through the elongate bore; and
downstream from the elongate bore, a module comprising an NMR detection compartment and an NMR rf microcoil, the module being insertable into the support body such that the NMR detection compartment is in fluid communication with the elongate bore.

88. A miniaturized total analysis system for liquid phase sample preparation and detection, comprising;
a microfabricated support body having first and second component halves each having substantially planar opposing interior and exterior surfaces;
a first microchannel microfabricated in the interior surface of the first support body half and a second microchannel microfabricated in the interior surface of the second support body half, wherein each of the microchannels is so arranged as to provide the mirror image of the other;
a sample processing compartment comprising an elongate bore formed by aligning the interior surfaces of the support body halves in facing abutment with each other whereby the microchannels define the elongate bore;
an inlet port and an outlet port communicating with the sample processing compartment, the ports enabling the downstream passage of fluid from an external source through the sample processing compartment; and
downstream from the sample processing compartment, a module comprising an NMR detection compartment and an NMR rf microcoil, the module being insertable into the support body such that the NMR detection compartment is in fluid communication with the sample processing compartment.

89. An integrated device for sample preparation and NMR detection, comprising:

(a) a miniaturized total analysis system for liquid phase sample preparation and detection, comprising:

a microfabricated support body having first and second component halves each having substantially planar opposing interior and exterior surfaces;

a first microchannel microfabricated in the interior surface of the first support body half and a second microchannel microfabricated in the interior surface of the second support body half, wherein each of the microchannels is so arranged as to provide the mirror image of the other;

an elongate bore formed by aligning the interior surfaces of the support body halves in facing abutment with each other whereby the microchannels define the elongate bore;

an inlet port and an outlet port communicating with the elongate bore, the ports enabling the downstream passage of fluid from an external source through the elongate bore; and downstream from the elongate bore, a module comprising an NMR detection compartment and an NMR rf microcoil, the module being insertable into the support body such that the NMR detection compartment is in fluid communication with the elongate bore; and (b) a magnet configured to accept the miniaturized total analysis system, wherein the device is capable of generating an NMR spectrum.

90. An integrated device for sample preparation and NMR detection, comprising:

(a) a miniaturized total analysis system for liquid phase sample preparation and detection, comprising:

a microfabricated support body having first and second component halves each having substantially planar opposing interior and exterior surfaces;

a first microchannel microfabricated in the interior surface of the first support body half and a second microchannel microfabricated in the interior surface of the second support body half, wherein each of the microchannels is so arranged as to provide the mirror image of the other;

a sample processing compartment comprising an elongate bore formed by aligning the interior surfaces of the support body halves in facing abutment with each other whereby the microchannels define the elongate bore;

an inlet port and an outlet port communicating with the sample processing compartment, the ports enabling the downstream passage of fluid from an external source through the sample processing compartment; and downstream from the sample processing compartment, a module comprising an NMR detection compartment and an NMR rf microcoil, the module being insertable into the support body such that the NMR detection compartment is in fluid communication with the sample processing compartment; and (b) a magnet configured to accept the miniaturized total analysis system, wherein the device is capable of generating an NMR spectrum.

* * * * *